United States Patent
Chen et al.

(10) Patent No.: US 8,149,007 B2
(45) Date of Patent: Apr. 3, 2012

(54) CARBON NANOTUBE SPRING CONTACT STRUCTURES WITH MECHANICAL AND ELECTRICAL COMPONENTS

(75) Inventors: Jimmy K. Chen, Pleasanton, CA (US); Treliant Fang, Dublin, CA (US); Michael Harburn, San Ramon, CA (US); Igor Y. Khandros, Orinda, CA (US); Rodney I. Martens, Livermore, CA (US); Gaetan L. Mathieu, Varennes (CA); Alexander H. Slocum, Bow, NH (US); Onnik Yaglioglu, Oakland, CA (US)

(73) Assignee: FormFactor, Inc., Livermore, CA (US)

( * ) Notice: Subject to any disclaimer, the term of this patent is extended or adjusted under 35 U.S.C. 154(b) by 267 days.

(21) Appl. No.: 12/421,805

(22) Filed: Apr. 10, 2009

(65) Prior Publication Data

US 2009/0197484 A1 Aug. 6, 2009

Related U.S. Application Data

(63) Continuation-in-part of application No. 11/872,008, filed on Oct. 13, 2007.

(60) Provisional application No. 61/093,677, filed on Sep. 2, 2008.

(51) Int. Cl.
*G01R 31/20* (2006.01)
*G01R 1/067* (2006.01)

(52) U.S. Cl. ......... 324/754.01; 324/755.01; 324/755.05; 324/755.08

(58) Field of Classification Search .................. None
See application file for complete search history.

(56) References Cited

U.S. PATENT DOCUMENTS

| | | | |
|---|---|---|---|
| 5,998,864 A | 12/1999 | Khandros et al. |
| 6,020,747 A | 2/2000 | Bahns et al. |
| 6,232,706 B1 | 5/2001 | Dai et al. |
| 6,346,189 B1 | 2/2002 | Dai et al. |
| 6,401,526 B1 | 6/2002 | Dai et al. |
| 6,457,350 B1 | 10/2002 | Mitchell |
| 6,597,090 B1 | 7/2003 | Mancevski |
| 6,626,684 B1 | 9/2003 | Stickler et al. |
| 6,627,980 B2 | 9/2003 | Eldridge |
| 6,800,865 B2 | 10/2004 | Nakayama et al. |
| 6,863,942 B2 | 3/2005 | Ren et al. |
| 6,882,546 B2 | 4/2005 | Miller |

(Continued)

FOREIGN PATENT DOCUMENTS

EP 1830367 9/2007

(Continued)

OTHER PUBLICATIONS

Yaglioglu et al., "Conductive Carbon Nanotube Composite Micro-Probes," Advanced Materials (2008), 20, pp. 357-362.

(Continued)

*Primary Examiner* — Vinh Nguyen
(74) *Attorney, Agent, or Firm* — Kirton & McConkie

(57) ABSTRACT

A composite spring contact structure includes a structural component and a conduction component distinct from each other and having differing mechanical and electrical characteristics. The structural component can include a group of carbon nanotubes. A mechanical characteristic of the composite spring contact structure can be dominated by a mechanical characteristic of the structural component, and an electrical characteristic of the composite spring contact structure can be dominated by an electrical characteristic of the conduction component. Composite spring contact structures can be used in probe cards and other electronic devices. Various ways of making contact structures are also disclosed.

40 Claims, 29 Drawing Sheets

U.S. PATENT DOCUMENTS

| | | |
|---|---|---|
| 6,890,506 B1 | 5/2005 | Harutyunyan et al. |
| 6,920,689 B2 | 7/2005 | Khandros et al. |
| 6,933,222 B2 | 8/2005 | Dubin et al. |
| 6,945,827 B2 | 9/2005 | Grube et al. |
| 6,967,013 B2 | 11/2005 | Someya et al. |
| 6,979,244 B2 | 12/2005 | Den et al. |
| 7,012,441 B2 | 3/2006 | Chou et al. |
| 7,082,683 B2 | 8/2006 | Han et al. |
| 7,094,123 B2 | 8/2006 | Oyama et al. |
| 7,132,039 B2 | 11/2006 | Anasawa et al. |
| 7,147,966 B2 | 12/2006 | Ren et al. |
| 7,160,531 B1 | 1/2007 | Jacques et al. |
| 7,189,430 B2 | 3/2007 | Ajayan et al. |
| 7,226,663 B2 | 6/2007 | Jiao et al. |
| 7,250,188 B2 | 7/2007 | Dodelet et al. |
| 7,251,884 B2 | 8/2007 | Grube et al. |
| 7,258,901 B1 | 8/2007 | Lee et al. |
| 7,378,328 B2 | 5/2008 | Choi et al. |
| 7,400,159 B2 | 7/2008 | Wang et al. |
| 7,585,548 B2 | 9/2009 | Wang et al. |
| 2003/0010910 A1 | 1/2003 | Colbert et al. |
| 2003/0153965 A1 | 8/2003 | Supronowicz et al. |
| 2003/0179559 A1 | 9/2003 | Engelhardt et al. |
| 2004/0036403 A1 | 2/2004 | Ouo et al. |
| 2004/0110003 A1 | 6/2004 | Cumings et al. |
| 2004/0113621 A1 | 6/2004 | Naughton |
| 2004/0208788 A1 | 10/2004 | Colton |
| 2005/0019245 A1 | 1/2005 | Koulikov |
| 2005/0285116 A1 | 12/2005 | Wang |
| 2006/0028220 A1 | 2/2006 | Malantonio et al. |
| 2006/0071334 A1 | 4/2006 | Kawabata et al. |
| 2006/0073089 A1 | 4/2006 | Ajayan et al. |
| 2006/0076690 A1 | 4/2006 | Khandros et al. |
| 2006/0085976 A1 | 4/2006 | Eldridge et al. |
| 2006/0103406 A1 | 5/2006 | Kitazawa et al. |
| 2006/0188721 A1 | 8/2006 | Irvin et al. |
| 2006/0197547 A1 | 9/2006 | Chen |
| 2006/0198956 A1 | 9/2006 | Eres |
| 2006/0252853 A1 | 11/2006 | Ajayan et al. |
| 2006/0290343 A1 | 12/2006 | Crafts et al. |
| 2007/0004191 A1 | 1/2007 | Gu et al. |
| 2007/0018098 A1 | 1/2007 | Nakayama et al. |
| 2007/0051887 A1 | 3/2007 | Hidaka et al. |
| 2007/0155158 A1 | 7/2007 | Gstrein et al. |
| 2007/0158584 A1 | 7/2007 | Lin |
| 2007/0158768 A1 | 7/2007 | Pilchowski et al. |
| 2007/0164214 A1 | 7/2007 | Choi et al. |
| 2007/0186665 A1 | 8/2007 | Hierold et al. |
| 2007/0213419 A1 | 9/2007 | Cao et al. |
| 2007/0218202 A1 | 9/2007 | Ajayan et al. |
| 2007/0235713 A1 | 10/2007 | Swirbel |
| 2007/0237990 A1 | 10/2007 | Kim |
| 2009/0066352 A1 | 3/2009 | Gritters et al. |
| 2009/0091343 A1 | 4/2009 | Wu et al. |
| 2009/0197484 A1 | 8/2009 | Chen et al. |

FOREIGN PATENT DOCUMENTS

| | | |
|---|---|---|
| EP | 1845124 | 10/2007 |
| WO | WO 00/73204 | 12/2000 |
| WO | WO 03/004155 | 1/2003 |
| WO | WO 2004/102582 | 11/2004 |
| WO | WO 2005/017977 | 2/2005 |
| WO | WO 2006/057659 | 6/2006 |
| WO | WO 2007/033188 | 3/2007 |
| WO | WO 2007/139244 | 12/2007 |
| WO | WO 2008/024726 | 2/2008 |
| WO | WO 2008/048938 | 4/2008 |

OTHER PUBLICATIONS

U.S. Appl. No. 12/632,428, filed Dec. 7, 2009, Eldridge et al.
U.S. Appl. No. 11/466,039, filed Aug. 21, 2006, Eldridge.
U.S. Appl. No. 12/418,438, filed Apr. 3, 2009, Fang et al.
U.S. Appl. No. 12/259,915, filed Oct. 28, 2008, Khandros et al.
U.S. Appl. No. 12/418,368, filed Apr. 3, 2009, Gritters et al.
Moloni et al., "Sharpened Carbon Nanotube Probes" (University of Wisconsin-Madison) (no date but downloaded from Internet on Sep. 6, 2007).
Pushparaj et al., "Effects of compressive strains on electrical conductivities of a macroscale carbon nanotube block," Applied Physics Letters 91, 153116 (2007).
Yaglioglu et al., "Conductive Carbon Nanotube Composite Micro-Probes," Nanoletters.
Yaglioglu et al., "Transfer and Reinforcement of Carbon Nanotube Structures with Epoxy," Precision Engineering Research Group, Dept. of Mechanical Engineering, Massachusetts Institute of Technology (presented at NTOG conference in Japan, Jun. 2006).
Yaglioglu, "Carbon Nanotube Based Electromechanical Probes," Thesis (Massachusetts Institute of Technology Jun. 2007).
Andrew et al., "Continuous production of aligned carbon nanotubes: a step closer to commercial realization," Chemical Physics Letters 303 (Apr. 16, 1999), pp. 467-474.
Greene, "Researchers Make Carbon Nanotubes Without Metal Catalyst," MIT News (Aug. 10, 2009) (2 pages).

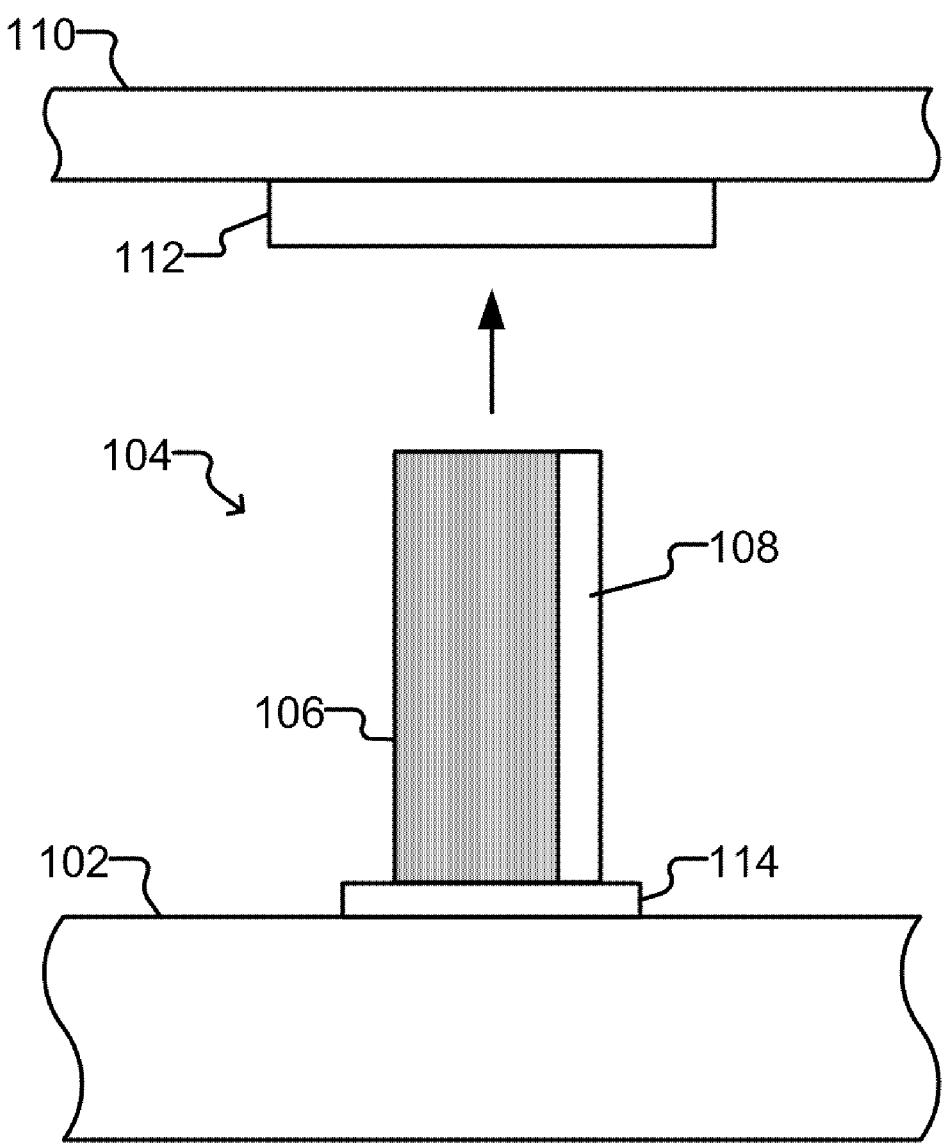

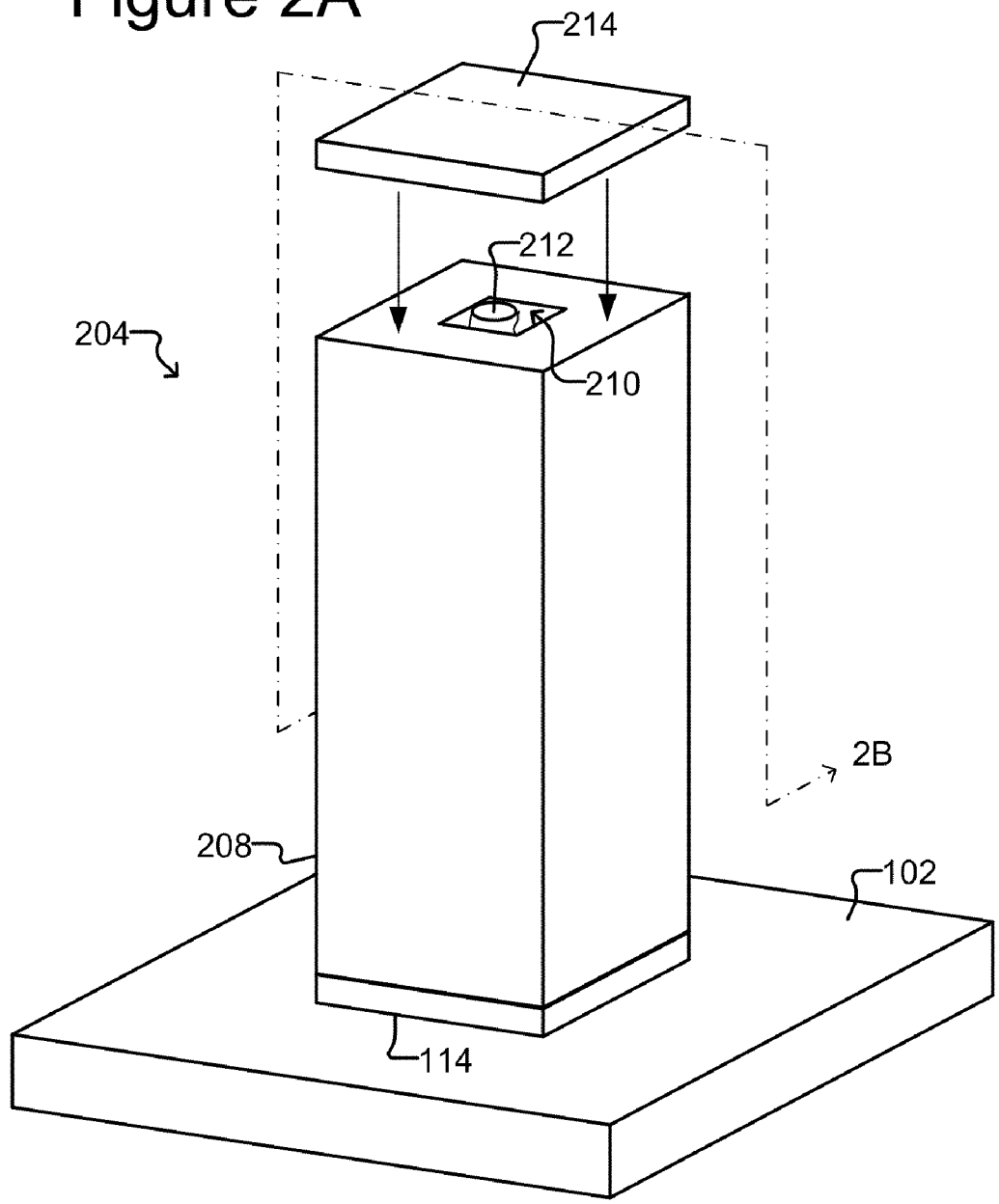

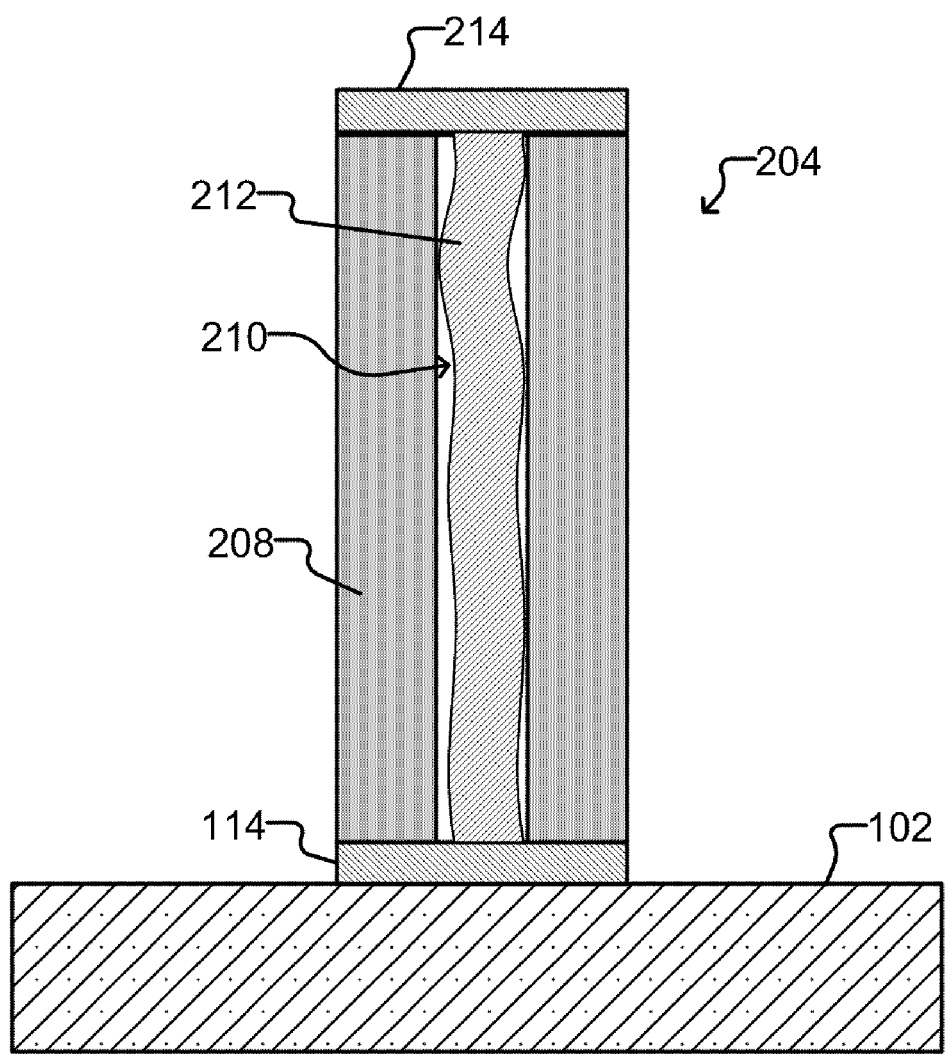

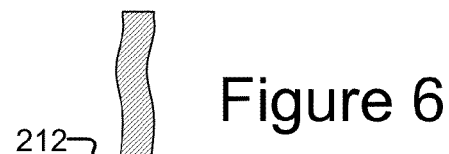
Figure 6
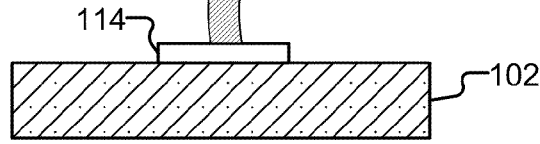
Figure 7
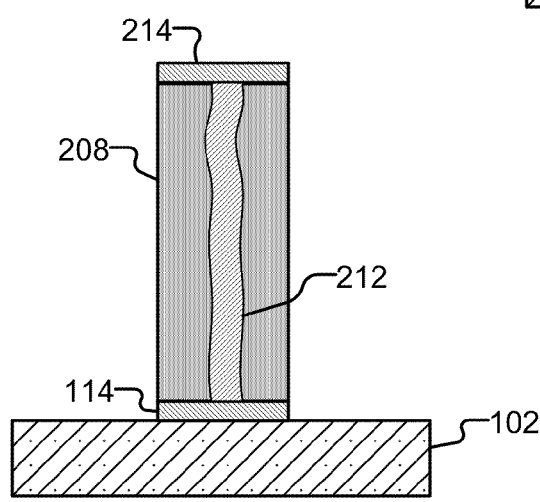
Figure 8
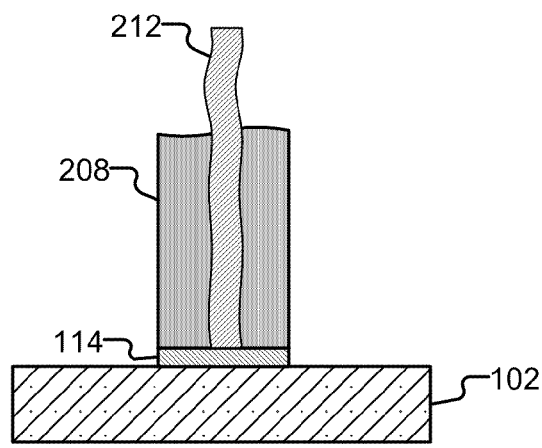

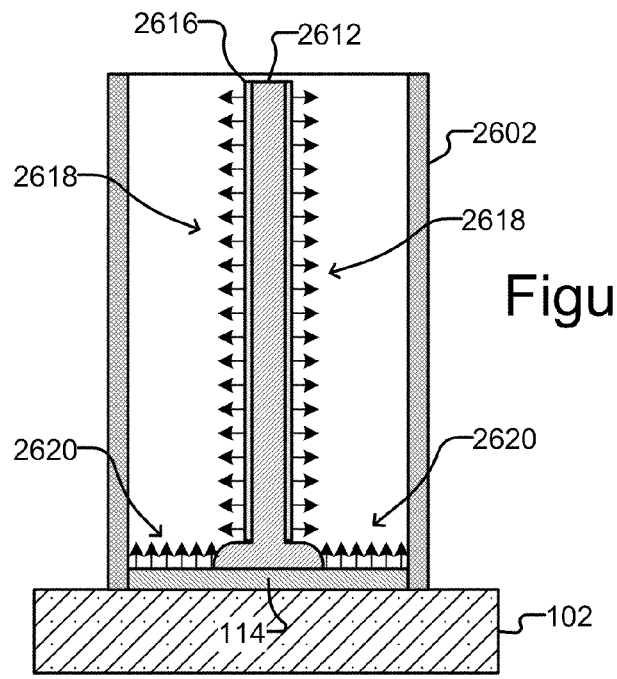
Figure 26A
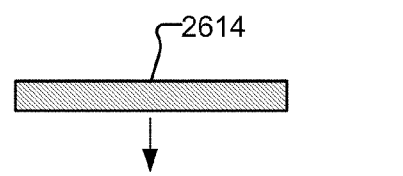
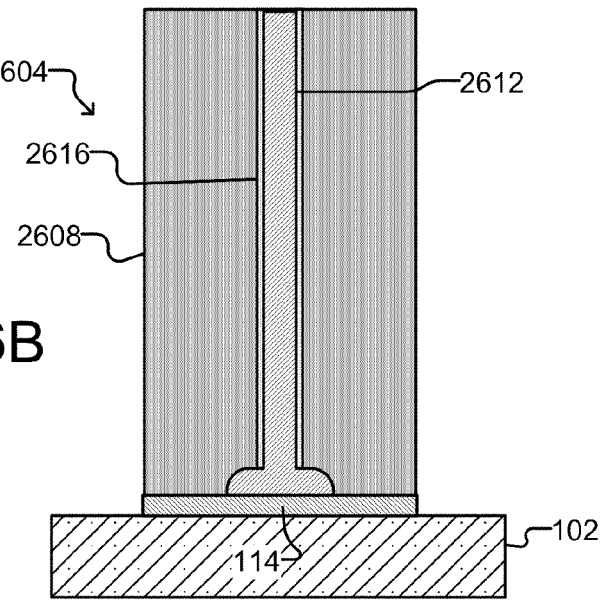
Figure 26B

CARBON NANOTUBE SPRING CONTACT STRUCTURES WITH MECHANICAL AND ELECTRICAL COMPONENTS

CROSS REFERENCE TO RELATED APPLICATIONS

The application is a Continuation in Part of co-pending U.S. patent application Ser. No. 11/872,008, filed Oct. 13, 2007, entitled "Making and Using Carbon Nanotube Probes."

This application claims the benefit of U.S. Provisional Patent Application Ser. No. 61/093,677, filed Sep. 2, 2008, entitled "Carbon Nanotube Spring Contact Structures with Mechanical and Electrical Components."

BACKGROUND

Electrically conductive spring contact structures on an electronic device can make temporary, pressure based electrical connections with terminals or other such input and/or outputs of a second electronic device. For example, the spring contact structures on the electronic device can be pressed against the terminals of the second electronic device to make temporary electrical connections between the spring contact structures and the terminals and thus between the electronic device and the second electronic device. Embodiments of the present invention are directed to improvements in such spring contact structures, processes of making such spring contact structures, and applications of such spring contact structures.

BRIEF DESCRIPTION OF THE DRAWINGS

FIG. 1 illustrates an example of a spring contact structure comprising a mechanical component and an electrical component according to some embodiments of the invention.

FIGS. 2A and 2B illustrate an example of a spring contact structure comprising a carbon nanotube structure and an electrical wire according to some embodiments of the invention.

FIGS. 6-8 illustrate another example of a process of making a spring contact structure like the spring contact structure of FIGS. 2A and 2B according to some embodiments of the invention.

FIGS. 26A-26B illustrate an example of a process of making a spring contact structure according to some embodiments of the invention.

FIGS. 28A-36B illustrate another example of a process of making a spring contact structure according to some embodiments of the invention.

DETAILED DESCRIPTION OF EXEMPLARY EMBODIMENTS

Figure 3:
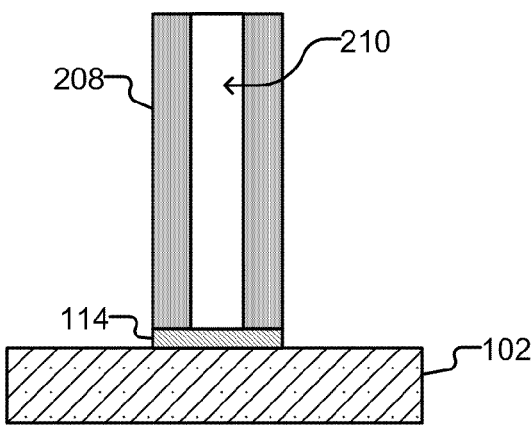
FIGS. 3-5 illustrate an example of a process of making a spring contact structure like the spring contact structure of FIGS. 2A and 2B according to some embodiments of the invention.

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

FIG. 1 illustrates a schematic depiction of a spring contact structure 104 on a substrate 102 according to some embodiments of the invention. Spring contact structure 104 can be for making pressure based temporary electrical connections with a terminal 112 of an electrical device 110. For example, spring contact structure 104 can be pressed against terminal 112. Spring characteristics of contact structure 104 can create a force against terminal 112 that creates an electrical connection between spring contact structure 104 and terminal 112 while spring contact structure 104 is pressed against terminal 112. Spring contact structure 104 can be electrically connected to a terminal 114 (which can be connected to external or internal wiring (not shown) on or in substrate 102), and spring contact structure 104 can thus create a temporary electrical connection between terminal 112 of electrical device 110 and terminal 114 of substrate 102. These temporary electrical connections can be used, for example, to test electrical functionality, and/or otherwise interact with the electrical device 110.

As shown in FIG. 1, spring contact structure 104 can comprise a mechanical component 106 (a non-limiting example of a structural component) that provides dominant mechanical characteristics of the spring contact structure 104 and an electrical component 108 (a non-limiting example of a conduction component) that provides dominant electrical characteristics of the spring contact structure 104. For example, one or more mechanical characteristics (e.g., spring constant, elastic range, etc.) of spring contact structure 104 can be substantially the same as corresponding mechanical characteristics of the mechanical component 106. In some embodiments, this can mean that mechanical characteristics of the electrical component 108 make a negligible contribution to the mechanical characteristics of the spring contact structure 104. Similarly, one or more electrical characteristics (e.g., electrical resistance or conductivity) of the spring contact structure 104 can be substantially the same as corresponding electrical characteristics of the electrical component 108, which can mean in some embodiments that electrical characteristics of the mechanical component 106 make a negligible contribution to the electrical characteristics of the spring contact structure 104. Alternatively, in some embodiments, the mechanical component 106 can have electrical characteristics that contribute somewhat or significantly to the overall electrical characteristics of the spring contact structure 104. For example, in some embodiments, the electrical characteristics of the mechanical component 106 can be approximately the same as the electrical characteristics of the electrical component 108.

Moreover, in some embodiments, the mechanical component 106 can be mechanically decoupled from the electrical component 108. Mechanically decoupled means: (1) the electrical conductivity (or resistance) of the electrical component 108 is not appreciably changed by elastic deformation of the mechanical component 106, and (2) the electrical component 108 does not appreciably affect the mechanical characteristics of the mechanical component 106. Alternatively or in addition, the electrical component 108 can be electrically decoupled from the mechanical component 106. Electrically decoupled means: (1) the mechanical properties of the mechanical component 106 are not appreciably changed by electrical conduction through electrical component 108, and (2) the mechanical component 106 does not appreciably affect the electrical characteristics of electrical component 108.

Mechanical component 106 can be resilient. In other words, the mechanical component can be capable of springing back to its original form or position after being bent or compressed by an applied force. In other words, mechanical component 106 can be elastically deformable over a predefined elastic range of forces. This means that a force within the predefined elastic range applied to mechanical component 106 can deform mechanical component 106, but when the force is removed, mechanical component 106 will return substantially to its original position and shape. For example, the mechanical component 106 can behave elastically over a range of about 0.1-50 grams (g) of applied force, although operation above or below this range can also be provided. As particular (though non-limiting) examples, the elastic range can be between 0.1 g-1 g or between 1 g-3 g. The electrical component 108 can be designed to move with the mechanical component 106 or otherwise constrained so that the electrical component 108 and mechanical component 106 move together. Mechanical component 106 can be configured to have predefined mechanical characteristics including but not limited to an elastic range, a spring constant, etc. In some cases, mechanical component 106 can experience plastic deformation (e.g., after many deformations of the mechanical component 106). Electrical component 108 need not have such mechanical characteristics. For example, electrical component 108 can be plastically deformable. For example, application of a force in the elastic range of mechanical component 106 can deform electrical component 108, which will not, by itself, return to its original position or shape upon removal of the force. Alternatively, electrical component 108 can be elastically deformable. In such a case, however, the counter force generated by the mechanical component 106 can dominate and be substantially equal to the counter force generated by the spring contact structure 104 in response to a deforming force applied to the contact structure 104.

Regardless of whether the electrical component 108 is elastically or plastically deformable, electrical component 108 can be configured to have predefined electrical characteristics such as, without limitation, a desired electrical resistance (or conductivity). Mechanical component 106 need not have such electrical characteristics. For example, mechanical component 106 can have a significantly higher electrical resistance than electrical component 108.

Note that the depiction in FIG. 1 is conceptual only and is intended to show only that spring contact structure 104 can have two functional components. The depiction in FIG. 1 is not intended to convey any particular spatial, structural, or other such relationship of the mechanical component 106 to the electrical component 108. For example, although shown side-by-side in FIG. 1, the mechanical component 106 and the electrical component 108 need not be side-by-side. As another non-limiting example, the mechanical component 106 need not be a single entity, nor does the electrical component 108 need to be a single entity.

As mentioned, the mechanical component 106 can provide dominant mechanical characteristics of the spring contact structure 104, and as such, the mechanical component 106 can be selected and/or optimized to provide desired mechanical characteristics of spring contact structure 104. In some embodiments, the mechanical component 106 can be a carbon nanotube structure (e.g., a structure comprising vertically aligned carbon nanotubes). Carbon nanotube structures can have mechanical properties (e.g., elastic range, spring constant, etc.) that are desirable in spring contact structure 104. Untreated carbon nanotube structures, however, do not typically have sufficiently low electrical resistance desired for spring contact structure 104, and treating such a carbon nanotube structure and/or individual carbon nanotubes to decrease electrical resistance typically also changes the mechanical properties of the carbon nanotube structure. The carbon nanotube structure that constitutes mechanical component 106 in FIG. 1 need not be treated to decrease its electrical resistance because spring contact structure 104 includes electrical component 108. Electrical component 108 can be any structure with the desired electrical characteristics (e.g., low electrical resistance) of spring contact structure 104. It is noted that electrical component 108 need not be selected for or treated to enhance its mechanical properties because mechanical component 106 provides the dominant mechanical properties of spring contact structure 104.

The carbon nanotube structure that constitutes mechanical component 106 in FIG. 1 can comprise, without limitation, one or more columns made of vertically aligned carbon nanotubes, which can be formed using any suitable process for forming columns of vertically aligned carbon nanotubes. For example and not by way of limitation, mechanical component 106 can comprise a column of vertically aligned carbon nanotubes grown on substrate 102 (e.g., on a terminal 114 of substrate 102). Alternatively, mechanical component 106 can comprise a column of vertically aligned carbon nanotubes grown on another substrate (not shown) and transferred to substrate 102 (e.g., to a terminal 114 of substrate 102). Moreover, whether grown on substrate 102 or on another substrate (not shown), the column of vertically aligned carbon nanotubes can be grown using any suitable process. For example and not by way of limitation, the column of vertically aligned carbon nanotubes can be grown using a floating catalyst process or a fixed catalyst process. In a floating catalyst process, a column of carbon nanotubes can be grown on a surface of a growth material (e.g., a seed layer, an oxide film on any material) by exposing the growth material to a material (e.g., a gas) comprising a catalyst (e.g., ferrocene) and a source of carbon (e.g., xylene). In a fixed catalyst process, a column of carbon nanotubes can be grown on a surface of a catalyst layer (e.g., iron) by exposing the catalyst layer to a material (e.g., a gas) comprising a source of carbon (e.g., hydrocarbon gas).

For example and not by way of limitation, a floating catalyst process will now be described. Carbon nanotubes are grown on substrate 102 by providing materials (e.g., a gas) comprising a catalyst and a source of carbon in the presence of proper ambient conditions. For example, substrate 102 can be placed in an interior of an enclosure such as a furnace (not shown), and the interior of the enclosure can be heated and a gas comprising a catalyst and a source of carbon can be introduced (e.g., pumped) into the interior of the enclosure. The specific catalyst material, carbon source material, and any other materials and the concentrations and mixtures of those materials as well as the specific ambient conditions (e.g., temperature) can be referred to as a "recipe," and any recipe suitable for growing carbon nanotubes on growth surfaces can be used.

The following is a non-limiting, exemplary recipe that can be used to grow carbon nanotubes. Substrate 102 can be placed in a furnace (not shown), which can be heated to about 750° Celsius. A gas comprising xylene (C8H10) as a carbon source and ferrocene (Fe(C5H5)2) as a catalyst can be mixed with a carrier gas (e.g., argon or another generally inert gas) and introduced (e.g., pumped) into the furnace (not shown). In some embodiments, the ratio of ferrocene to xylene mixed with the carrier gas can be about one gram of ferrocene per one hundred milliliters of xylene, and the ferrocene/xylene mixture can be mixed with the carrier gas at a temperature of about 150° Celsius at a rate of about 6 milliliters per hour. The foregoing recipe can produce carbon nanotubes that are vertically aligned. As mentioned, the foregoing recipe is exemplary only, and other materials comprising a catalyst and a source of carbon can be utilized. Moreover, the growth surface can be exposed to the foregoing catalyst and source of carbon at temperatures other than 750° Celsius.

As another example, and not by way of limitation, a fixed catalyst process will now be described. A buffer layer can be provided on substrate 102 and a catalyst layer formed on the buffer layer. The catalyst layer can comprise catalyst material that, as generally discussed above, can cause growth of carbon nanotubes (which can be vertically aligned) in the presence of a source of carbon. The buffer layer can provide a buffer between the substrate 102 and the catalyst layer. The buffer layer can be any material that does not appreciably react with the catalyst material and/or the material that is the source of carbon. Aluminum oxide (Al2O3) is a non-limiting example of a suitable buffer layer. Catalyst layer can comprise a material that, in the presence of a source of carbon, causes growth of carbon nanotubes. Catalyst layer can be formed by depositing catalyst material only on selected areas of buffer layer. Alternatively, catalyst layer can formed by depositing catalyst material as a blanket layer of material on buffer layer and then removing selected portions of the deposited catalyst material, leaving the catalyst material in a pattern and shapes that correspond to desired locations and cross-sectional shapes of the carbon nanotube columns to be grown on the catalyst layer.

Carbon nanotubes can be grown by providing a material (e.g., a gas) comprising a source of carbon in the presence of proper ambient conditions. For example, substrate 102 with buffer layer and catalyst layer can be placed in an interior of an enclosure such as a furnace (not shown), and the interior of the enclosure can be heated and a gas comprising a source of carbon can be introduced (e.g., pumped) into the interior of the enclosure. The specific material that composes the catalyst layer, the specific material that composes the source of carbon, and any other materials and the concentrations and mixtures of those materials as well as the specific ambient conditions (e.g., temperature) can be referred to as a "recipe." Any recipe suitable for growing carbon nanotubes on catalyst layer can be used to grow carbon nanotubes.

The following is an exemplary, non-limiting recipe that can be used to grow carbon nanotubes. The catalyst layer can comprise any transition metal. For example, the catalyst layer can comprise iron (Fe). For example, the catalyst layer can comprise a layer of iron (Fe), and buffer layer can comprise aluminum oxide (Al2O3). In some embodiments, the thickness of an iron (Fe) film and an aluminum oxide (Al2O3) film can be about 1.2 nm of iron (Fe) and about 10 nm of aluminum oxide (Al2O3). Substrate 102 can be placed in a furnace (not shown), which can be heated to about 750° Celsius, and a hydrocarbon gas can be introduced into the furnace. Under such conditions, the catalyst layer can catalyze the growth of carbon nanotubes on the patterned catalyst layer from carbon in the hydrocarbon gas. In some embodiments, after the substrate 102 is placed in the furnace (not shown), the furnace can be operated as follows. For about 10 minutes, while the furnace is at a temperature of about 0° Celsius, an inert gas (e.g., argon) can be pumped through the furnace at a flow rate of about 400 standard cubic centimeters per minute (sccm). Then, for about 15 minutes, while the temperature in the furnace (not shown) is changed from 0° Celsius to 750° Celsius, and thereafter for about 10 minutes while the temperature is maintained at 750° Celsius, the inert gas can continue to be pumped through the furnace at a flow rate of about 400 sccm. Thereafter, for about 5 minutes, while the temperature is maintained at about 750° Celsius, a gas containing hydrogen H2 can be mixed with the inert gas flowing through the furnace (not shown) at about 400 sccm. For example, the gas containing hydrogen can be H2/Ar in a ratio of about 40 parts of H2 to about 15 parts of Ar. Thereafter, a source of carbon can be added to the inert gas flowing through the furnace while maintaining the furnace at 750° Celsius. For example, the source of carbon can be a gas comprising C2H4/H2/Ar in a ratio of about 10 parts of C2H4, 40 parts of H2, and 10 parts of Ar, which can result in the growth of carbon nanotubes on the catalyst layer from carbon in the gas. The carbon nanotubes can grow from the catalyst layer as vertically aligned carbon nanotube columns. As mentioned, the foregoing recipe is exemplary only, and other materials can comprise the catalyst layer, and a different source of carbon can be utilized. Moreover, the catalyst layer can be exposed to the foregoing source of carbon at temperatures other than 750° Celsius. Moreover, different gas mixtures, flow rates, and time periods can be used.

FIGS. 2A and 2B illustrate a non-limiting example embodiment of the spring contact structure 104 of FIG. 1 in the form of spring contact structure 204 comprising a carbon nanotube structure 208, electrically conductive wire 212, and electrically conductive cap 214 according to some embodiments of the invention. Spring contact structure 204 can be a non-limiting example of spring contact structure 104 in FIG. 1; carbon nanotube structure 208 can be a non-limiting example of mechanical component 106 in FIG. 1; and wire 212 and cap 214 can be a non-limiting example of electrical component 108 of FIG. 1.

As shown in FIGS. 2A and 2B, carbon nanotube structure 208 can be disposed on terminal 114 of substrate 102 and can include a hollow portion 210. An electrically conductive wire 212 can be disposed in the hollow portion 210, and an electrically conductive cap 214 can be disposed on an end of the carbon nanotube structure 208. The wire 212 can contact both the terminal 114 and the cap 214. In some embodiments, wire 212 can be attached to one or both of terminal 114 and cap 214. The wire 212 can be made of a material that has a desired low level of electrical resistance. The wire 212 can be resilient and therefore under compression between the cap 214 and terminal 114 so that the wire 212 remains in electrical contact with the terminal 114 and the cap 214 over the operating range of the spring contact structure 204 (e.g., the elastic range of the carbon nanotube structure 208). Alternatively, the wire 212 can be attached to the terminal 114 and the cap 214 so that the wire remains in electrical contact with the terminal 114 and the cap 214 over the operating range of the spring contact structure 204. The wire 212 can also be of low mechanical stiffness relative to carbon nanotube structure 208. Wire 212 can be, for example, a wire comprising a conductive material such as copper, gold, or other such material including alloys of the foregoing. As another non-limiting example, wire 212 can comprise a bundle of conductive nanowires. Cap 214 can also comprise a conductive material such as the materials mentioned above for wire 212. Alternatively, cap 214 can comprise a material or materials that are both conductive and wear resistant. Non-limiting examples of such materials include without limitation, nickel, palladium, rhodium, and alloys of the foregoing including without limitation palladium-cobalt and rhodium-cobalt.

Carbon nanotube structure 208 in FIGS. 2A and 2B can be, for example and not by way of limitation, a column of vertically aligned carbon nanotubes as generally discussed above with respect to FIG. 1. As such, carbon nanotube structure 208 can provide desired mechanical characteristics of spring contact structure 204, such as desired elastic range, spring constant, etc. Carbon nanotube structure 208 can, but need not be, highly electrically conductive. This is because wire 212 and cap 214 can provide a highly conductive (i.e., a low resistance) electrical path through spring contact structure 204. Similarly, wire 212 and cap 214 need not provide desired mechanical characteristics because, as discussed above, carbon nanotube structure 208 can provide desired mechanical characteristics of spring contact structure 204. In some embodiments, carbon nanotube structure 208 can be mechanically decoupled (as defined above) from wire 212 and cap 214, and/or wire 212 and cap 214 can be electrically decoupled (as defined above) from carbon nanotube structure 208. In some embodiments, carbon nanotube structure 208 can be elastically deformable in a particular elastic range while wire 212 and/or cap 214 are not elastically deformable, by themselves, over all or part of the elastic range of the carbon nanotube structure 208. Wire 212 and/or cap 214 can, however, be plastically deformable. As another non-limiting example, wire 212 can be elastically deformable but may have a lower stiffness than carbon nanotube structure 208. In some embodiments, wire 212 and cap 214 can have a significantly lower electrical resistance than carbon nanotube structure 208.

Spring contact structure 204 is exemplary only and many variations are possible. For example, although one wire 212 is shown in FIGS. 2A and 2B, a plurality of wires 212 can be in hollow portion 210. As another non-limiting example, carbon nanotube structure 208 need not be rectangular but can be other shapes including without limitation cylindrical. Hollow portion 210 also need not be rectangular but can but other shapes including without limitation cylindrical. Moreover, the shape of the carbon nanotube structure 208 can be different from the shape of the hollow portion 210. As still another non-limiting example, cap 214 need not be flat. By way of example and not limitation, cap 214 can comprise one or more shapes configured to facilitate contact with terminal 112 of electronic component 110 (see FIG. 1). For example, an outer surface (in FIGS. 2A and 2B a top surface) of cap 214 can comprise structures (e.g., a sharp tip or sharp corners or tips) configured to penetrate terminal 112. Non-limiting examples of shapes of such structures include a pyramid, truncated pyramid, or blade shape.

Figure 4:
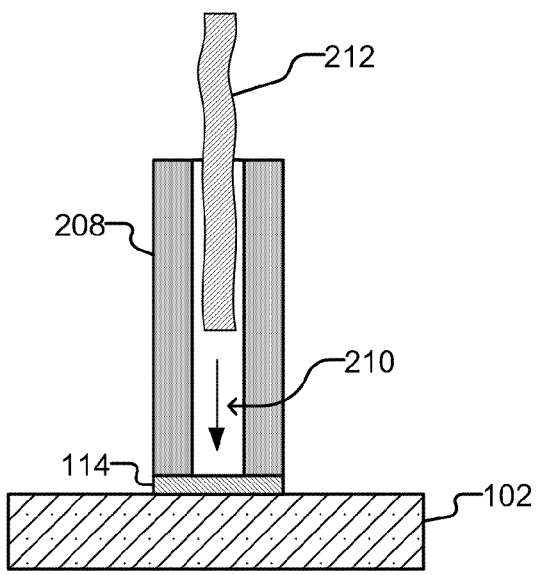
Figure 5:
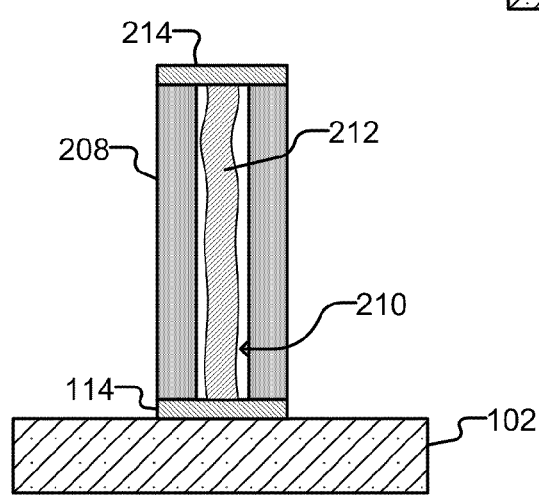

FIGS. 3-5 illustrate a non-limiting example of a process for making a spring contact structure like the spring contact structure 204 of FIGS. 2A and 2B. As shown in FIG. 3, carbon nanotube structure 208 with hollow portion 210 can be formed on or otherwise attached to terminal 114 of substrate 102. As mentioned, carbon nanotube structure 208 can comprise one or more columns of vertically aligned carbon nanotubes, and as such, carbon nanotube structure 208 can be formed in any of the ways discussed above with respect to FIG. 1. For example, carbon nanotube structure 208 can be grown on terminal 114 or grown on another substrate (not shown) and transferred to terminal 114. Also, whether grown on terminal 114 or on another substrate (not shown), carbon nanotube structure 208 can be grown using a floating catalyst method or a fixed catalyst method. Hollow portion 210 can be formed in any suitable manner. For example, carbon nanotube structure 208 can be grown around a plug (not shown), which can be removed, leaving hollow portion 210. As another non-limiting example, carbon nanotube structure 208 can be grown on a seed material (not shown) patterned such that the carbon nanotube structure 208 does not grow on a center portion (or other portion) of the seed material. As yet another non-limiting example, an interior (or other) portion (not shown but corresponding to hollow portion 210) can be removed (e.g., by cutting, ablating, etching, etc.) from carbon nanotube structure 208.

As shown in FIG. 4, wire 212 can be inserted into hollow portion 210. As mentioned above, more than one wire 212 can be inserted into hollow portion 210. As shown in FIG. 5, cap 214 can be attached (e.g., soldered, welded, adhered with an adhesive, etc.) to an end of carbon nanotube structure 208. Wire 212 can be longer than the length of hollow portion 210 so that wire 212 is compressed between terminal 114 and cap 214. Alternatively or in addition, wire 212 can be attached (e.g., soldered, bonded, adhered, etc.) to terminal 114 and/or cap 214.

The method illustrated in FIGS. 3-5 is exemplary only and other methods can be used to make a spring contact structure like 204. FIGS. 6-8 illustrate a non-limiting example of such other methods.

FIGS. 6-8 illustrate another non-limiting example of a process for making a spring contact structure like the spring contact structure 204 of FIGS. 2A and 2B. As shown in FIG. 6, wire 212 can be attached (e.g., bonded, soldered, welded, adhered with an electrically conductive adhesive, etc.) to or otherwise held in place on terminal 114 of substrate 102. Although one wire 212 is shown, multiple such wires can be attached or held in place on terminal 114. As shown in FIG. 7, carbon nanotube structure 208 can be formed (e.g., grown, attached to, etc.) on terminal 114 around wire 212. For example, carbon nanotube structure 208 can be, as discussed above, one or more columns of vertically aligned carbon nanotubes, and such column or columns can be grown on terminal 114 around wire 212. Alternatively, carbon nanotube structure 208 can be formed on another substrate (not shown) with hollow portion 210 generally as shown in FIG. 3 and then transferred from the other substrate (not shown) to terminal 114 such that wire 212 is inside hollow portion 210. As shown in FIG. 8, cap 214 can be attached (e.g., soldered, welded, adhered with an adhesive, etc.) to an end of carbon nanotube structure 208. Wire 212 can extend the length of carbon nanotube structure 208 such that wire 212 contacts both terminal 114 and cap 214.

Figure 9A:
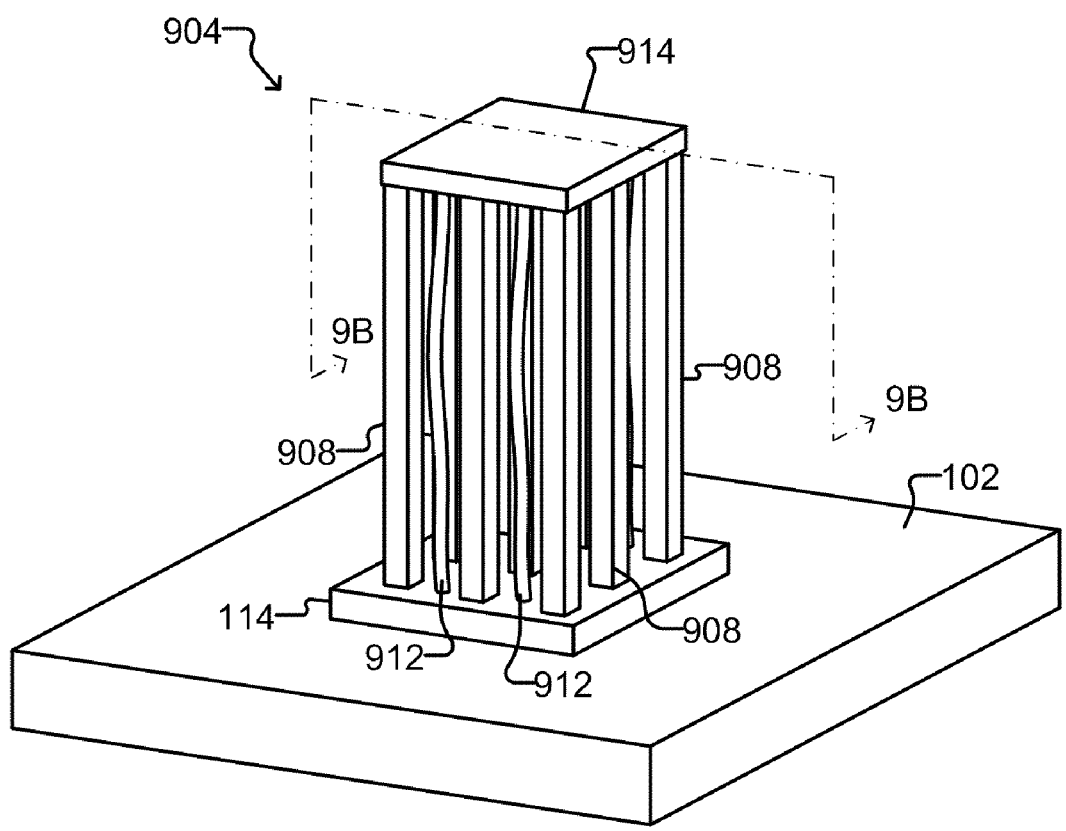
FIGS. 9A and 9B illustrate an example of a spring contact structure comprising carbon nanotube columns and electrical wires according to some embodiments of the invention.
Figure 9B:
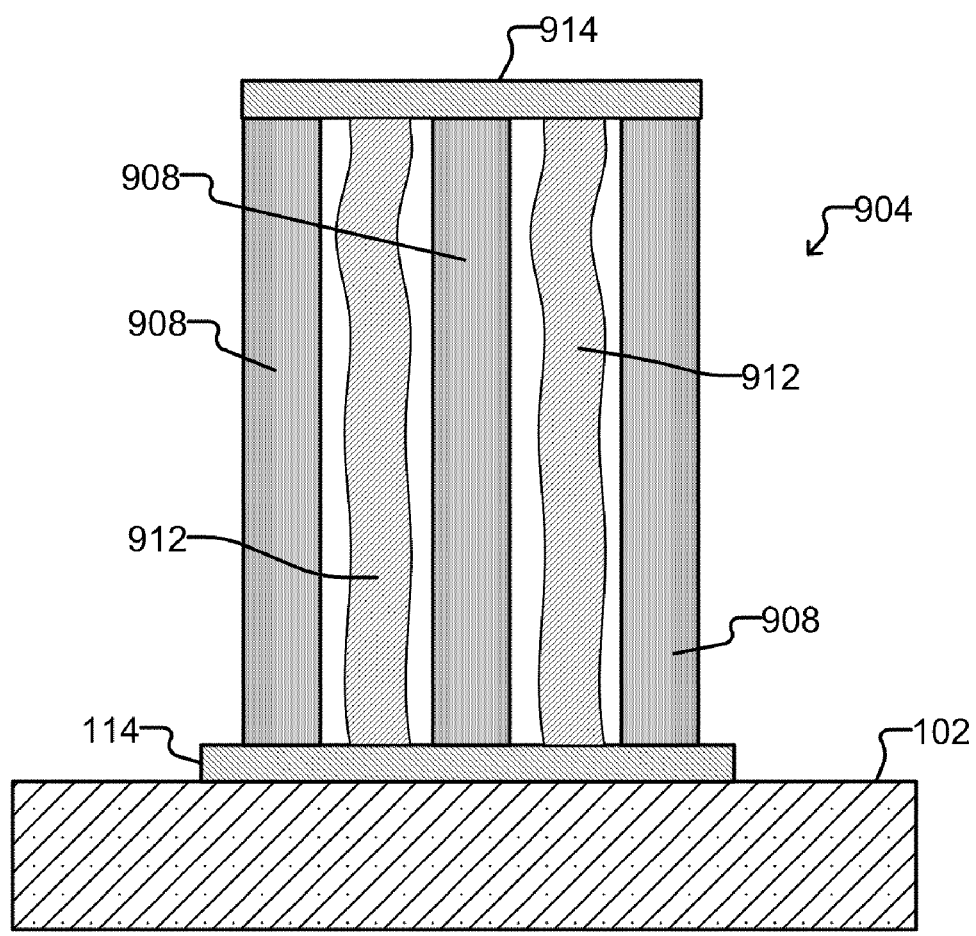

FIGS. 9A and 9B illustrate another non-limiting example of the spring contact structure 104 of FIG. 1 in the form of spring contact structure 904 according to some embodiments of the invention. As shown in FIGS. 9A and 9B, spring contact structure 904 can comprise a plurality of carbon nanotube columns 908 and a plurality of wires 912 attached at one end to terminal 114 of substrate 102. As shown, the wires 912 can be interspersed between the carbon nanotube columns 908. Spring contact structure 904 can also include a cap 914 attached to opposite ends of the carbon nanotube columns 908 and the wires 912.

The carbon nanotube columns 908 can each be a column of vertically aligned carbon nanotubes. In some non-limiting examples, carbon nanotube columns 908 can be the same as or generally similar to carbon nanotube structure 208 of FIGS. 2A and 2B except thinner so that a plurality of such carbon nanotube columns 908 along with a plurality of wires 912 can be disposed on terminal 114. Also, carbon nanotube columns 908 need not have a hollow portion like hollow portion 210 of FIGS. 2A and 2B. Wires 912 can be the same as or generally similar to wire 212 of FIGS. 2A and 2B, and conductive cap 914 can be the same as or similar to cap 214 of FIGS. 2A and 2B.

The carbon nanotube structure columns 908 can provide dominant mechanical characteristics of spring contact structure 904 and can thus be a non-limiting example of mechanical component 106 in FIG. 1. The wires 912 and cap 914 can provide dominant electrical characteristics of spring contact structure 904 and thus be a non-limiting example of electrical component 108 of FIG. 1. In some embodiments, carbon nanotube columns 908 can be mechanically decoupled (as defined above) from wires 912 and cap 914, and/or wire 912 and cap 914 can be electrically decoupled (as defined above) from carbon nanotube columns 908. In some embodiments, carbon nanotube columns 908 can be elastically deformable in a particular elastic range while wires 912 are not elastically deformable, by themselves, over all or part of the elastic range of the carbon nanotube columns 908. Alternatively, wires 912 can be elastically deformable over all of the elastic range of the carbon nanotube columns 908. In some embodiments, wires 912 and cap 914 can have a significantly lower electrical resistance than carbon nanotube columns 908. Alternatively, nanotube columns 908 can be electrically conductive. Cap 914 can be generally inelastic (rigid) over the elastic range of the carbon nanotube columns 908.

Spring contact structure 904 is exemplary only and many variations are possible. For example, a different number and/or pattern of carbon nanotube columns 908 and/or wires 912 than shown in FIGS. 9A and 9B can be used. As another non-limiting example, carbon nanotube columns 908 need not be rectangular but can be other shapes including without limitation cylindrical. As still another non-limiting example, cap 914 need not be flat but can have other shapes including without limitation any of the shapes and variations thereof discussed above for cap 214.

Figure 10:
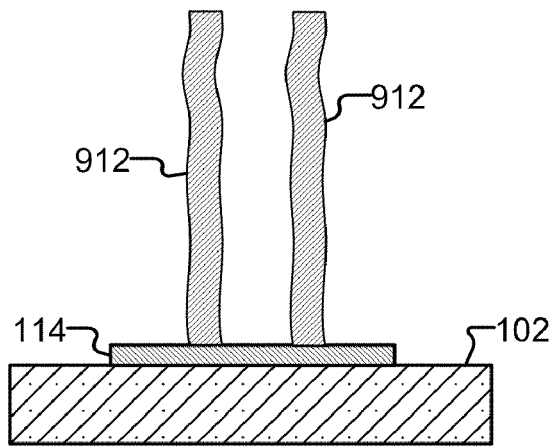
FIGS. 10-12 illustrate an example of a process of making a spring contact structure like the spring contact structure of FIGS. 9A and 9B according to some embodiments of the invention.
Figure 11:
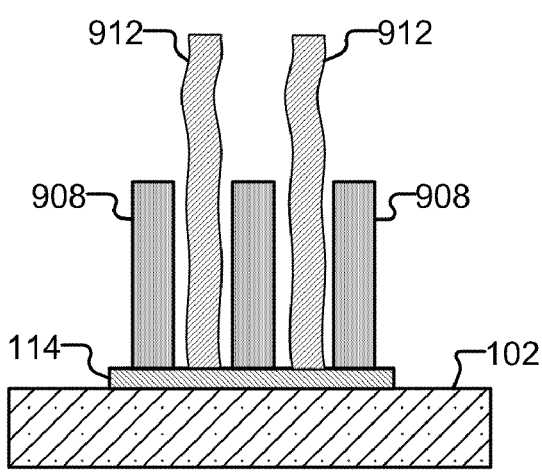
Figure 12:
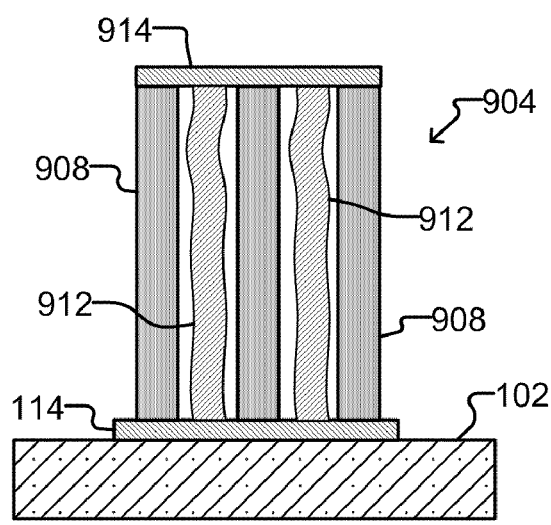

FIGS. 10-12 illustrate a non-limiting example of a process for making a spring contact structure like the spring contact structure 904 of FIGS. 9A and 9B. As shown in FIG. 10, wires 912 can be attached (e.g., bonded, soldered, welded, adhered with an electrically conductive adhesive, etc.) to terminal 114 of substrate 102. Although two wires 912 are shown, only one wire 912 or more than two wires 912 can be attached to terminal 114 in FIG. 10. As shown in FIG. 11, carbon nanotube columns 908 can be formed on terminal 114. For example, carbon nanotube columns 908 can be, as discussed above, one or more columns of vertically aligned carbon nanotubes, and such columns can be grown on terminal 114. Terminal 114 can be masked so that carbon nanotube columns 908 only grow on portions of terminal 114 defined by the masking (not shown). As another non-limiting example, carbon nanotube columns 908 can be grown on a seed material (not shown) on terminal 114, and the seed material can be pattern such that carbon nanotube columns 908 grow only on portions of terminal 114. Alternatively, carbon nanotube columns 908 can be formed on another substrate (not shown) and then transferred from the other substrate (not shown) to terminal 114. As shown in FIG. 12, cap 914 can be attached (e.g., soldered, welded, adhered with an adhesive, etc.) to ends of carbon nanotube structures 908 and ends of wires 912. Wires 912 can extend from terminal 114 to cap 914.

Figure 13:
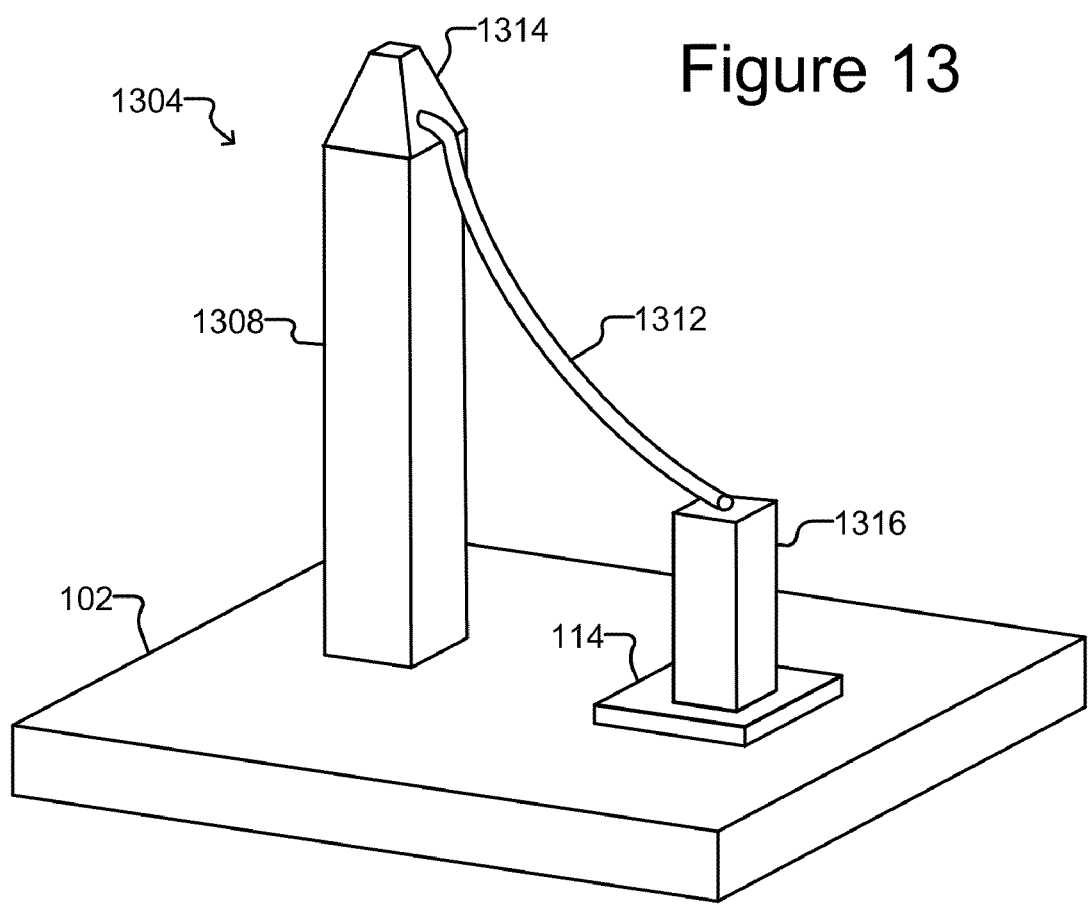
FIG. 13 illustrate an example of a spring contact structure comprising a carbon nanotube structure and an electrical connection according to some embodiments of the invention.

FIG. 13 illustrates another non-limiting example embodiment of the spring contact structure 104 of FIG. 1 in the form of spring contact structure 1304 according to some embodiments of the invention. As shown in FIG. 13, spring contact structure 1304 can comprise a carbon nanotube structure 1308 to which a conductive cap 1314 can be attached. The carbon nanotube structure 1308 can be attached to a surface of substrate 102, and a conductive post 1316 can be attached to terminal 114. An electrically conductive wire 1312 or other connector can electrically connect cap 1314 to post 1316.

The carbon nanotube structure 1308 can be a column of vertically aligned carbon nanotubes. In some non-limiting examples, carbon nanotube structure 1308 can be the same as or generally similar to carbon nanotube structure 208 of FIGS. 2A and 2B except carbon nanotube structure 1308 can lack a hollow portion like hollow portion 210 of FIGS. 2A and 2B. Conductive cap 1314 can be the same as or similar to cap

214 of FIGS. 2A and 2B. As mentioned above, cap 214 can be shaped like a truncated pyramid generally, as cap 1314 is illustrated in FIG. 13. Alternatively, cap 1314 (like cap 214) can have other shapes such as a pyramid or a blade, or cap 1314 can be flat like 214 is shown in FIGS. 2A and 2B. Wire 1312 can be any electrically conductive wire or other type of electrical connector, and post 1316 can be any electrically conductive structure. As shown, wire 1312 can be attached (e.g., bonded, soldered, welded, adhered with a conductive adhesive, etc.) at one end to cap 1314 and at the other end to post 1316.

The carbon nanotube structure 1308 can provide dominant mechanical characteristics of spring contact structure 1304 and can thus be a non-limiting example of mechanical component 106 in FIG. 1. The cap 1314, wire 1312, and post 1316 can provide dominant electrical characteristics of spring contact structure 1304 and thus be a non-limiting example of electrical component 108 of FIG. 1. In some embodiments, carbon nanotube column 1308 can be mechanically decoupled (as defined above) from cap 1314, wire 1312, and post 1316; and/or cap 1314, wire 1312, and post 1316 can be electrically decoupled (as defined above) from carbon nanotube column 1308. In some embodiments, carbon nanotube structure 1308 can be elastically deformable in a particular elastic range while cap 1314, wire 1312, and/or post 1316 are not elastically deformable, by themselves, over all or part of the elastic range of carbon nanotube structure 1308. Cap 1314, wire 1312, and/or post 1316, however, can be plastically deformable. In some embodiments, wire 1312 is compliant, but post 1316 need not be compliant. In some embodiments, cap 1314, wire 1312, and post 1316 can have a significantly lower electrical resistance than carbon nanotube structure 1308.

Spring contact structure 1304 is exemplary only and many variations are possible. For example, carbon nanotube structure 1308 need not be rectangular but can be other shapes including without limitation cylindrical. As another non-limiting example, carbon nanotube structure 1308 can comprise a plurality of thinner carbon nanotube columns, for example, like carbon nanotube columns 908 in FIGS. 9A and 9B. As yet another non-limiting example, post 1316 need not be used. Rather, wire 1312 can be connected from cap 1314 directly to terminal 114. As still another non-limiting example, carbon nanotube structure 1308 and post 1316 can both be attached to terminal 114. As yet another non-limiting example, cap 1314 need not have a truncated pyramid shape but can have other shapes including without limitation the alternative shapes discussed.

Figure 14:
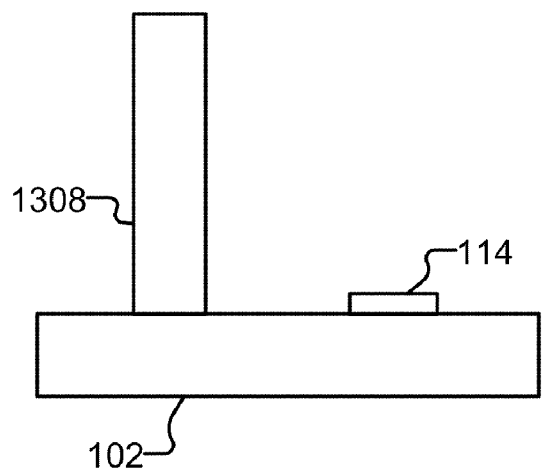
FIGS. 14-17 illustrate an example of a process of making a spring contact structure like the spring contact structure of FIG. 13 according to some embodiments of the invention.

FIGS. 14-17 illustrate a non-limiting example of a process for making a spring contact structure like the spring contact structure 1304 of FIG. 13. As shown in FIG. 14, carbon nanotube structure 1308 can be formed on or otherwise attached to substrate 102. As mentioned, carbon nanotube structure 1308 can comprise one or more columns of vertically aligned carbon nanotubes, and as such, carbon nanotube structure 1308 can be formed in any of the ways and variations thereof discussed above with respect to FIG. 1. For example, carbon nanotube structure 1308 can be grown on substrate 102 or grown on another substrate (not shown) and transferred to substrate 102. Also, carbon nanotube structure 1308 can be grown using a floating catalyst method or a fixed catalyst method.

Figure 15:
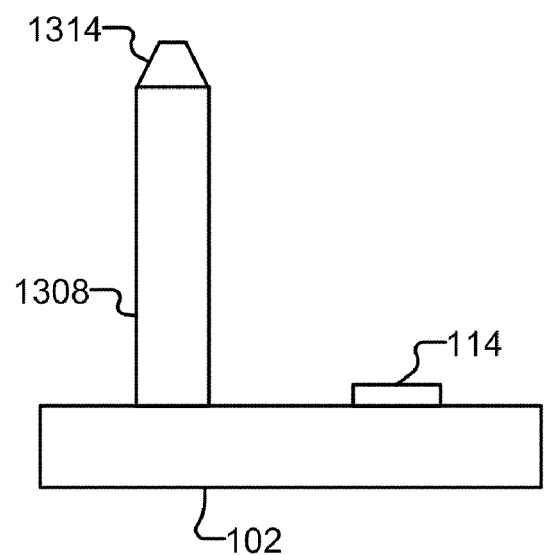
Figure 16:
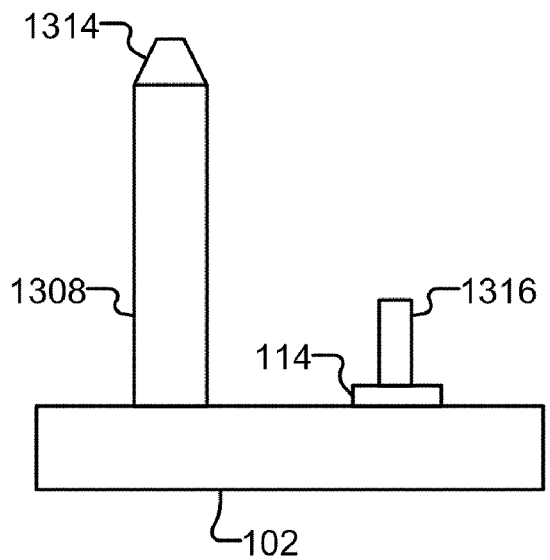
Figure 17:
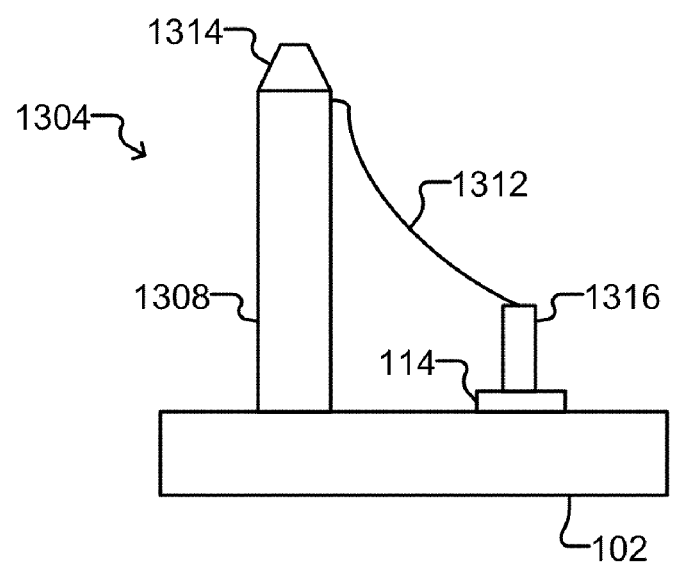

As shown in FIG. 15, cap 1314 can be attached (e.g., soldered, welded, adhered with an adhesive, etc.) to an end of carbon nanotube structure 1308. As shown in FIG. 16, post 1316 can be formed on or attached (soldered, welded, adhered with a conductive adhesive, etc.) to terminal 114. Post 1316 can be any electrically conductive structure and can be formed on terminal 114 or formed elsewhere and attached to terminal 114. As shown in FIG. 17, wire 1312 can be attached (e.g., bonded (e.g., by conventional wiring bonding processes), soldered, welded, adhered with a conductive adhesive, etc.) at one end to cap 1314 and at another end to post 1316.

The process illustrated in FIGS. 14-17 is an example only, and many variations are possible. For example, the order in which the operations are performed can be changed. As another non-limiting example, as mentioned above, post 1316 need not be used. Consequently, the operation shown in FIG. 16 can be skipped, and wire 1312 can be connected from cap 1314 directly to terminal 114 in FIG. 17.

Figure 18A:
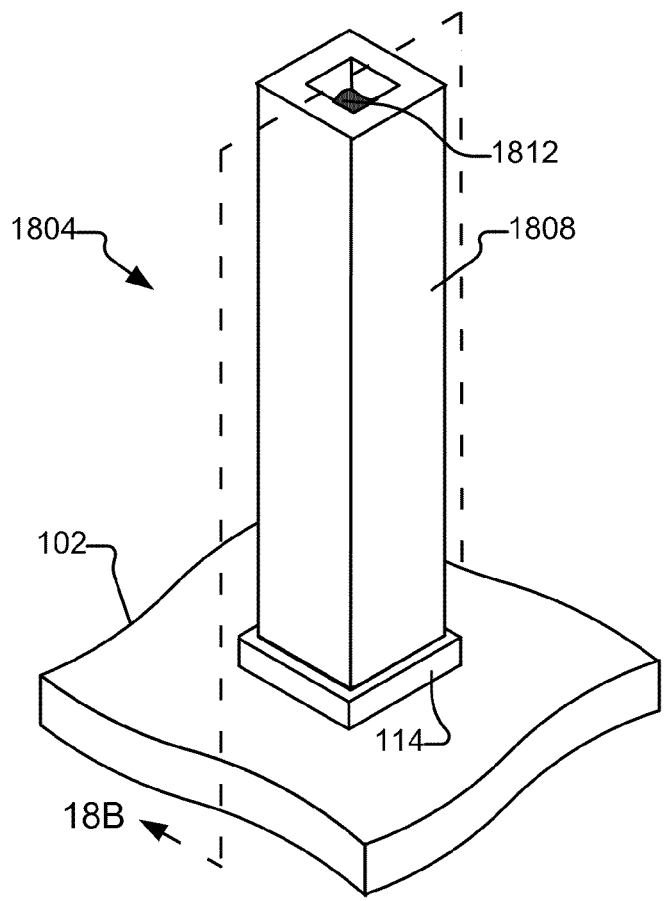
FIGS. 18A and 18B illustrate an example of a spring contact structure comprising an electrically conductive material in a hollow portion of a carbon nanotube structure according to some embodiments of the invention.
Figure 18B:
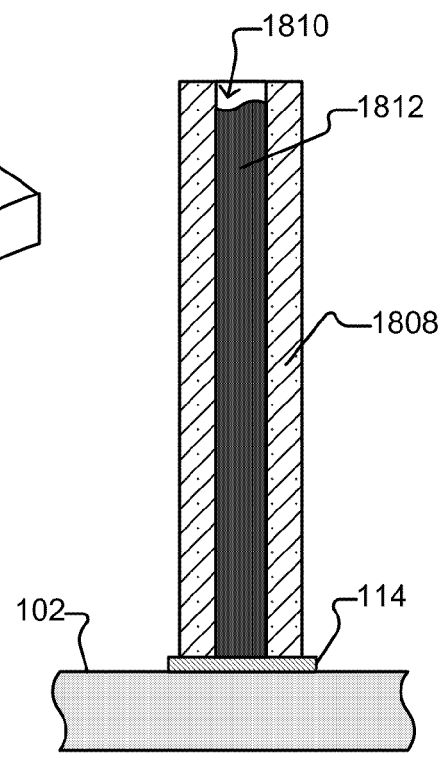

FIGS. 18A and 18B illustrate another non-limiting example of an embodiment of the spring contact structure 104 of FIG. 1 in the form of spring contact structure 1804 according to some embodiments of the invention. FIG. 18A shows a perspective view and FIG. 18B shows a side-cross sectional view of spring contact structure 1804. Spring contact structure 1804 can comprise conductive material 1812 in a hollow portion 1810 of a carbon nanotube column 1808, which can be attached to terminal 114 of substrate 102. Carbon nanotube column 1808 can be, for example, a column of vertically aligned carbon nanotubes. As mentioned, column 1808 can include a hollow portion 1810, which as shown can extend the length of column 1808. Generally speaking, column 1808 can be formed using any of the techniques described herein and variations thereof for forming columns of vertically aligned carbon nanotubes. Hollow portion 1810 can be formed in the same or similar way as hollow portion 210 of FIGS. 2A and 2B. Although column 1808 and hollow portion 1810 are shown with a square-type cross-section, other types of cross sections are equally contemplated including without limitation a circular cross-section.

As shown in FIGS. 18A and 18B, hollow portion 1810 can be filled with an electrically conductive material 1812, which can be any electrically conductive material that can be deposited into hollow portion 1810. (For ease of illustration, hollow portion 1810 is shown in FIGS. 18A and 18B partially filled with conductive material 1812, but hollow portion 1810 can be fully filled with conductive material 1812.) In some embodiments, conductive material 1812 can have a greater electrical conductivity than column 1808. In some embodiments, conductive material 1812 can comprise a conductive material with a relatively low melting point that can be deposited into hollow portion 1810 while melted and then allowed to cool. For example, conductive material 1812 can be solder. As another non-limiting example, conductive material 1812 can be a curable material that is deposited into hollow portion 1810 in a flowable or semi-flowable state and then cured, causing the conductive material 1812 to solidify inside hollow portion 1810. For example, conductive material 1812 can be a curable conductive epoxy. Alternatively, conductive material 1812 can remain in a liquid or semi-liquid state and be functional in the liquid or semi-liquid state. As yet another example, conductive material 1812 can be a resilient electrically conductive polymer. Although not shown in FIGS. 18A and 18B, a conductive cap (e.g., like cap 214 including any variation of cap 214 discussed herein) can be attached (e.g., soldered, welded, adhered with an epoxy, etc.) to the upper (as oriented in FIGS. 18A and 18B) end of column 1808, and conductive material 1812 can extend within hollow portion 1810 from terminal 114 to the conductive cap (not shown) if present.

Column 1808 can provide dominant mechanical characteristics of spring contact structure 1804 and can thus be a non-limiting example of mechanical component 106 in FIG. 1. The conductive material 1812 and cap (not shown), if present, can provide dominant electrical characteristics of spring contact structure 1804 and thus be a non-limiting example of electrical component 108 of FIG. 1. If the cap (not shown) is not present, conductive material 1812, which as discussed above, can fill hollow portion 1810 and thus provide a direct electrical connection from terminal 114 to the end of column 1808 opposite terminal 114, can by itself be a non-limiting example of electrical component 108 of FIG. 1.

In some embodiments, carbon nanotube column 1808 can be mechanically decoupled (as defined above) from conductive material 1812 and/or, if present, cap (not shown). Similarly, in some embodiments conductive material 1812 and/or, if present, cap (not shown) can be electrically decoupled (as defined above) from carbon nanotube column 1808. In some embodiments, carbon nanotube column 1808 can be elastically deformable in a particular elastic range while conductive material 1812 is not elastically deformable, by itself, over all or part of the elastic range of the carbon nanotube column 1808. Conductive material 1812 can, however, be plastically deformable over the particular elastic range. Cap (not shown), if present, can be rigid over the particular elastic range. In some embodiments, conductive material 1812 and, if present, cap (not shown) can have a significantly lower electrical resistance than carbon nanotube column 1808.

Figure 19:
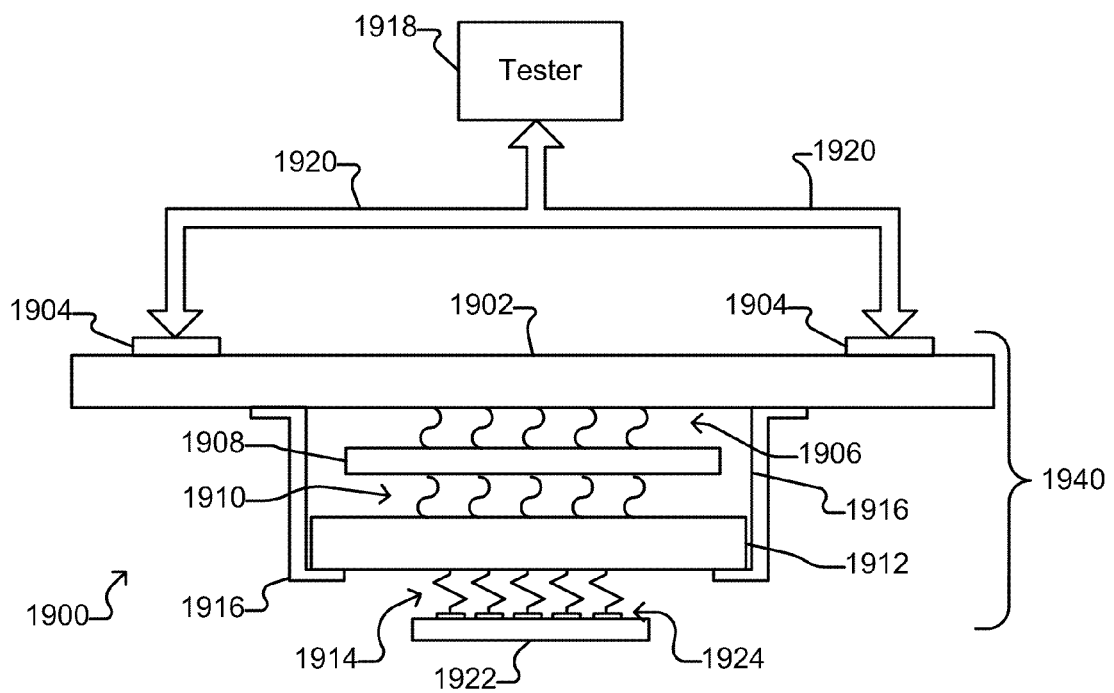
FIG. 19 illustrates a test system with a probe card assembly that can include spring contact structures comprising a mechanical component and an electrical component according to some embodiments of the invention.

There are many possible uses and applications for spring contact structure 104 (including without limitation spring contact structures 204, 904, 1304, and 1804 and any variations of those spring contact structures described herein). FIG. 19 illustrates a non-limiting example in which spring contact structure 104 can be part of a probe card assembly for testing DUT 1922. DUT 1922 (which can be an acronym for device under test) can be any electronic device or devices to be tested, including without limitation one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronic devices, one or more printed circuit boards, or any other type of electronic device or devices. FIG. 19 shows an exemplary probe card assembly 1940 and a simplified block diagram of a test system 1900 in which the probe card assembly 1940 can be used to test DUT 1922 according to some embodiments of the invention. As will be seen, spring contact structures 1906, spring contact structures 1910, and/or electrically conductive resilient probes 1914 can comprise spring contact structures 104. Alternatively, spring contact structures 1906, spring contact structure 1910, and/or probes 1914 can be other types of contact structures.

As shown in FIG. 19, the probe card assembly 1940 can comprise a wiring substrate 1902, an interposer 1908, and a probe head 1912. Brackets 1916 and/or other suitable means can hold the wiring substrate 1902, interposer 1908, and probe head 1912 together. The wiring substrate 1902 can be a printed circuit board, ceramic substrate, or the like. The wiring substrate 1902 can include electrical connectors 1904 configured to make electrical connections with a plurality of communications channels 1920 to and from a tester 1918. Connectors 1904 can be pads for receiving pogo pins, zero-insertion-force connectors, or any other electrical connection device suitable for making electrical connections with communications channels 1920. Electrically conductive paths (not shown) can be provided through the probe card assembly 1940 to provide electrical connections from individual electrical connections in connectors 1904 (each such individual electrical connection can correspond to one of communication channels 1920) to electrically conductive resilient probes 1914, which can contact input and/or output terminals 1924 of DUT 1922. Those conductive paths (not shown) through the probe card assembly 1940 can comprise electrically conductive connections, such as traces and/or vias (not shown), from the connectors 1904 through the wiring substrate 1902 to electrically conductive terminals (not shown) on the wiring substrate 1902 in contact with spring contact structures 1906; electrically conductive connections, such as vias (not shown), through interposer 1908 electrically connecting the spring contact structures 1906 with spring contact structures 1910; and electrically conductive connections, such as traces and vias (not shown), through the probe head 1912 between electrically conductive terminals (not shown) on the probe head 1912 in contact with the spring contact structures 1910 and probes 1914. In this way, a plurality of signal paths comprising the communications channels 1920, the above-described conductive paths through the probe card assembly 1940, and the probes 1914 are provided between the tester 1918 and the input and/or output terminals 1924 of DUT 1922.

The configuration of probe card assembly 1940 shown in FIG. 19 is exemplary only and is simplified for ease of illustration and discussion. Many variations, modifications, and additions are possible. For example, although the probe card assembly 1940 is illustrated in FIG. 19 as having three substrates—the wiring substrate 1902, the interposer 1908, and the probe head 1912—the probe card assembly 1940 can have more or fewer than three substrates. For example, probe head 1912 can be attached and/or electrically connected directly to the wiring substrate 1902, which can eliminate interposer 1908. As another non-limiting example, the probe card assembly 1940 can have more than one probe head 1912, and each such probe head 1912 can be independently adjustable. As another non-limiting example, spring contact structures 1906, 1910 can be mounted on interposer 1908 to contact terminals (not shown) on wiring substrate 1902 and probe head 1912, or spring contact structures 1906 can be mounted on wiring substrate 1902 to contact terminals (not shown) on interposer 1908, or spring contact structures 1910 can be mounted on probe head 1912 to contact terminals (not shown) on interposer 1908. As another non-limiting example, probes 1914 can be replaced with terminals (not shown) on probe head 1912 arranged to contact spring contact structures (not shown) disposed on DUT 1922. In general, positions of spring contact structures and corresponding terminals with which they make be swapped.

DUT 1922 can be tested as follows. Terminals 1924 of DUT 1922 can be pressed against probes 1914, causing probes 1914 to form temporary, pressure based electrical connections with terminals 1924. The tester 1918 can generate test signals, which can be provided through the communications channels 1920, probe card assembly 1940, and probes 1914 to input terminals 1924 of DUT 1922. Response signals generated by DUT 1922 can be sensed by probes 1914 in contact with output terminals 1924 of DUT 1922 and provided through the probe card assembly 1940 and communications channels 1920 to the tester 1918. The tester 1918 can analyze the response signals to determine whether DUT 1922 responded properly to the test signals and, consequently, whether DUT 1922 passes or fails the testing. The tester 1918 can alternatively or in addition rate the performance of DUT 1922.

Figure 20:
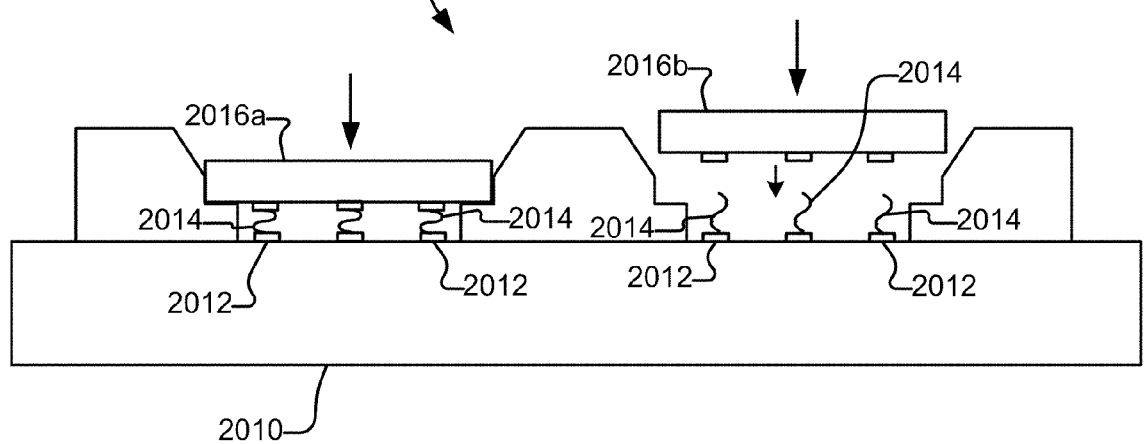
FIG. 20 illustrates a test socket that can include spring contact structures comprising a mechanical component and an electrical component according to some embodiments of the invention.

Spring contact structure 104 is not limited to use in a test system or probe card assembly like those illustrated in FIG. 19. FIG. 20 illustrates a non-limiting example in which spring contact structures 104 can be used in a test socket. FIG. 20 illustrates an exemplary test socket 2000 having a substrate 2010, terminals 2012, and spring contact structures 2014, which can be spring contact structure 104. As shown in FIG. 20, test socket 2000 can be used to test electronic devices such as electronic devices 2016a, 2016b, which can be like DUT 1922. FIG. 20 depicts electronic device 2016a being pressed against spring contact structures 2014 of the test socket 2000, and FIG. 20 depicts electronic device 2016b in the process of being pressed against the spring contact structures 2014. In some embodiments, substrate 2010—which can be a wiring substrate with electrical contacts for connecting to a test controller and internal wiring connecting the electrical contacts to contact structures 2014—can be connected to a test controller, which can control testing of electronic devices 2016a and 2016b.

Figure 21:
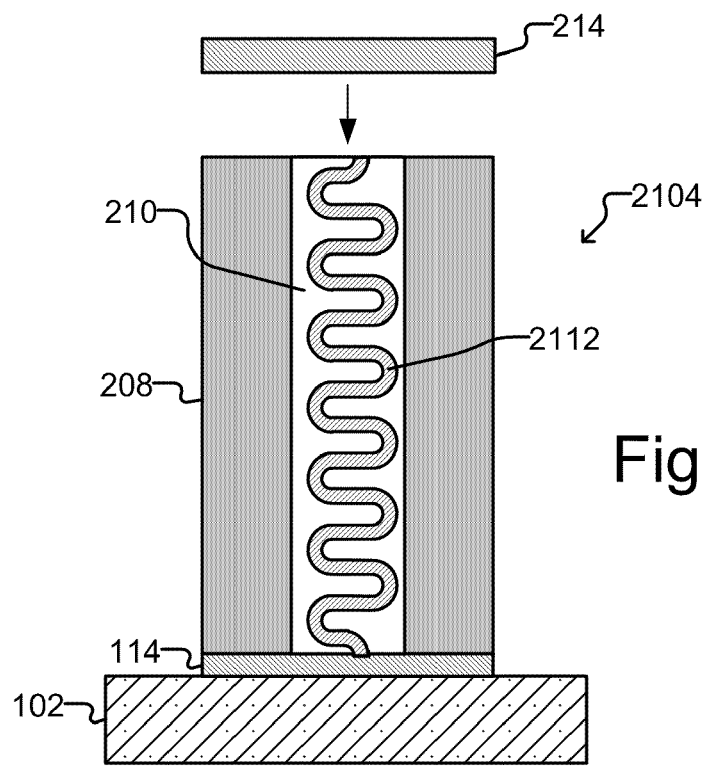
FIG. 21 illustrates an example of a spring contact structure comprising a carbon nanotube structure and serpentine electrical conductor disposed in a hollow portion of the carbon nanotube structure according to some embodiments of the invention.
Figure 22:
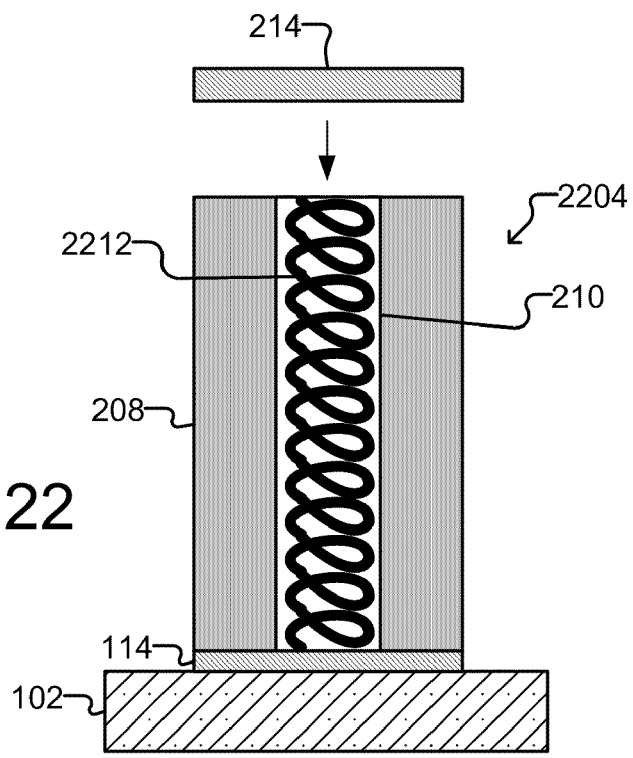
FIG. 22 illustrates an example of a spring contact structure comprising a carbon nanotube structure and coiled electrical conductor disposed in a hollow portion of the carbon nanotube structure according to some embodiments of the invention.

FIGS. 21 and 22 illustrate in cross section additional non-limiting examples of embodiments of the spring contact structure 104 of FIG. 1 in the form of spring contact structures 2104, 2204 according to some embodiments of the invention. The spring contact structure 2104 of FIG. 21 is generally similar to the spring contact structure 204 of FIGS. 2A and 2B, except that an electrically conductive wire 2112 having a serpentine shape is used. Electrically conductive wire 2112 can be disposed in the hollow portion 210 of carbon nanotube structure 208. Electrically conductive wire 2112 can be electrically connected to electrically conductive cap 214 and to terminal 114 of substrate 102. Electrically conductive wire 2112 can be similar to wire 212 described above. Because the wire 2112 is serpentine shaped, the length of the wire 2112 can be longer than the height of carbon nanotube structure 208.

The spring contact structure 2204 of FIG. 21 is also generally similar to the spring contact structure 204 of FIGS. 2A and 2B, except than an electrically conductive wire 2212 having a spiral or coiled shape is used. Electrically conductive wire 2212 can be similar to wire 212 described above. Wire 2212 can be longer than length of carbon nanotube structure 208. Other arrangements similar to FIGS. 21 and 22 can be used where the conductive wire is replaced by an electrically conductive material such as steel wool or foamed porous metal structure.

Figure 23:
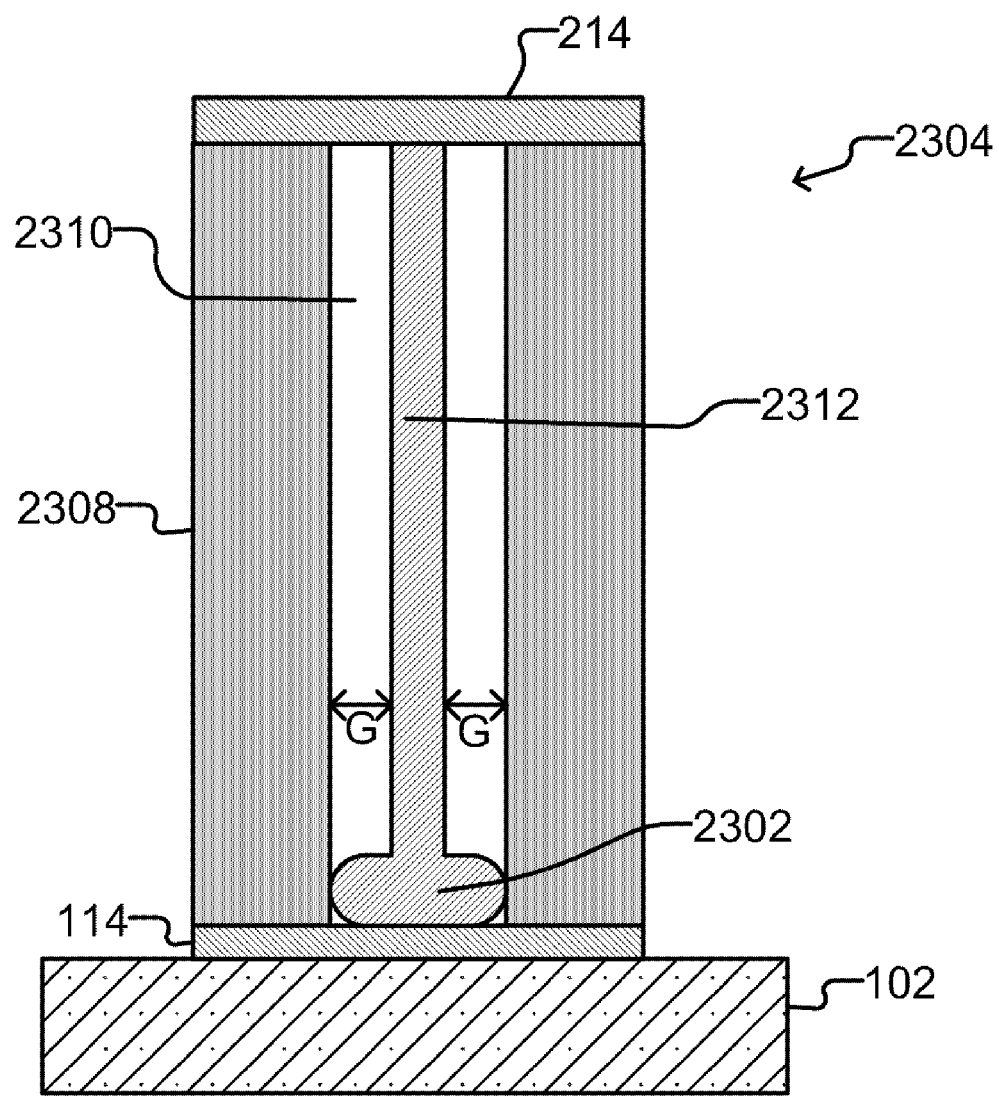
FIG. 23 illustrates an example of a spring contact structure comprising a carbon nanotube structure and an electrical connection separated from the carbon nanotube structure by a gap according to some embodiments of the invention.

FIG. 23 illustrates in cross section another non-limiting example of an embodiment of the spring contact structure 104 of FIG. 1 in the form of spring contact structure 2304 according to some embodiments of the invention. The spring contact structure 2304 can include a carbon nanotube structure 2308, electrically conductive wire 2312, and electrically conductive cap 214. Carbon nanotube structure 3208 can be disposed on terminal 114 of substrate 102 and can include a hollow portion 2310. Electrically conductive wire 2312 can be disposed in the hollow portion 210, and an electrically conductive cap 214 can be disposed on an end of the carbon nanotube structure 3208. The wire 2312 can electrically connect to the terminal 114 and to the cap 214. Wire 2312 can be generally similar to wire 312 as described above.

Wire 2312 can include a ball 2302 at the end. For example, wire 2312 can be attached to terminal 114 by wire bonding equipment. Spring contact structure 2304 can therefore be made as follows. Wire 2312 can be bonded to terminal 114. Carbon nanotubes can be grown on terminal 114. For example, carbon nanotube structure 2308 can be, as discussed above, vertically aligned carbon nanotubes grown on terminal 114. As another non-limiting example, carbon nanotube structure 2308 can be grown on a seed material (not shown) on terminal 114. Carbon nanotubes do not grow from the portion of the terminal 114 covered by ball 2302, therefore a gap G can be formed between wire 2312 and carbon nanotube structure 2308, thus creating hollow portion 2310 in the carbon nanotube structure 2308. In other words, a space is created between the wire 2312 and the carbon nanotube structure 2308.

FIGS. 24A-25C illustrate another non-limiting example of the spring contact structure 104 of FIG. 1 in the form of spring contact structure 2404 according to some embodiments of the invention. As shown in a top view in FIG. 24A and in cross section view in FIG. 24B, spring contact structure 2404 can comprise a carbon nanotube structure 2408 having a space 2410 along the length of the structure. For example, space 2410 can be created by removal of a portion of a grown column, for example by laser ablation, etching, cutting etc. As another non-limiting example, space 2410 can be created by growing carbon nanotubes having the desired shape. For example, carbon nanotubes can be grown on growth material (not shown) patterned on the terminal 114 as generally described above.

Figure 24A:
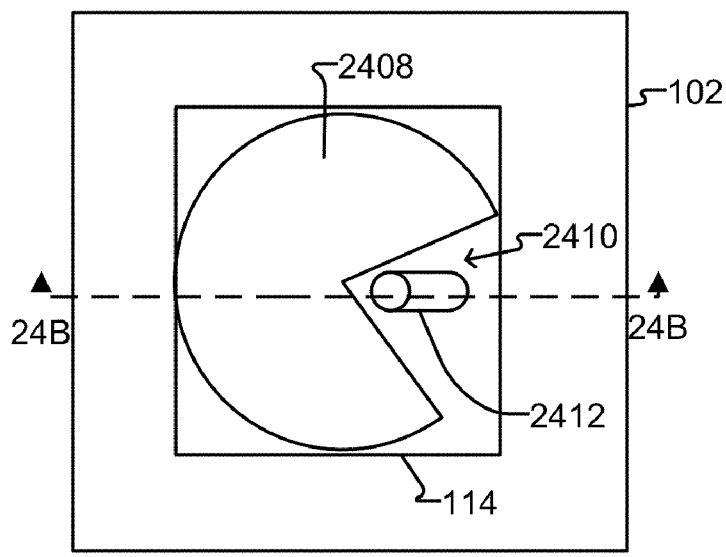
FIGS. 24A-24C illustrate an example of a spring contact structure comprising a carbon nanotube structure with an open portion and an electrical connection disposed in the open portion according to some embodiments of the invention.
Figure 24B:
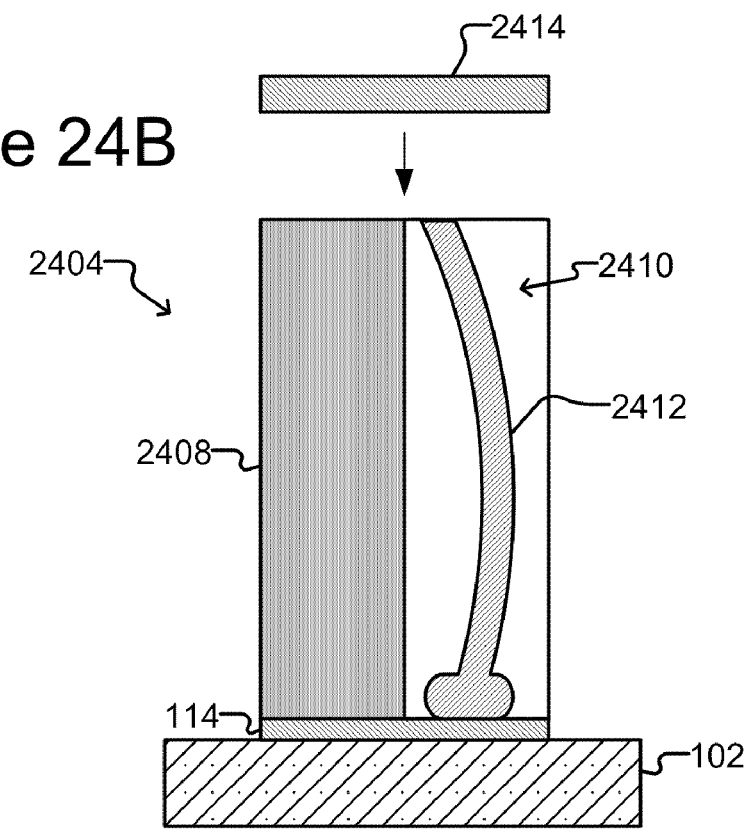

Disposed in space 2410 can be an electrically conductive structure 2412 (e.g., a wire or prebent wire). The electrically conductive structure 2412 can be electrically connected (e.g., attached) to the terminal. The electrically conductive structure can extend the length of the carbon nanotube structure 2408. A cap 2414 (e.g., like cap 214 in FIG. 2A) can be attached to an upper end of the carbon nanotube structure 2408 as shown in FIG. 24B and electrically connected to electrically conductive structure 2412.

Figure 24C:
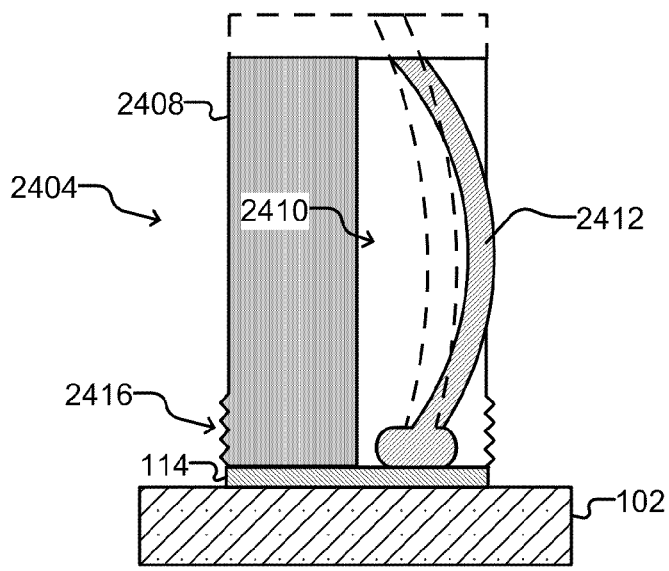

As seen best in cross section view in FIG. 24C, the conductive structure 2412 can be bent to bias the conductive structure 2412. When bent in such a manner, the conductive structure can therefore move in a predetermined direction when the spring contact structure 2404 is compressed. For example, when a downward force is applied to the cap 2414, this can cause the carbon nanotube structure 2408 to compress at portions of base end 2416 (moving from the position show in dotted lines to the position shown in solid lines). Conductive structure 2412 can flex outward, moving in generally the direction of the bend. This can help to avoid movement of the conductive structure 2412 from interfering with mechanical properties of the carbon nanotube structure 2408 or damaging the carbon nanotube structure 2408.

The carbon nanotube structure 2408 can provide dominant mechanical characteristics of spring contact structure 2404 and can thus be a non-limiting example of mechanical component 106 in FIG. 1. The conductive structure 2412 and cap 2414 can provide dominant electrical characteristics of spring contact structure 2404 and thus be a non-limiting example of electrical component 108 of FIG. 1. In some embodiments, carbon nanotube structure 2408 can be mechanically decoupled (as defined above) from conductive structure 2412 and cap 2414, and/or conductive structure 2412 and cap 2414 can be electrically decoupled (as defined above) from carbon nanotube structure 2408. In some embodiments, conductive structure 2412 and cap 2414 can have a significantly lower electrical resistance than carbon nanotube structure 2408. Alternatively, carbon nanotube structure 2408 can be electrically conductive. Cap 2414 can be like any of cap 214, 914, 1314 and variations thereof described above.

Figure 25:
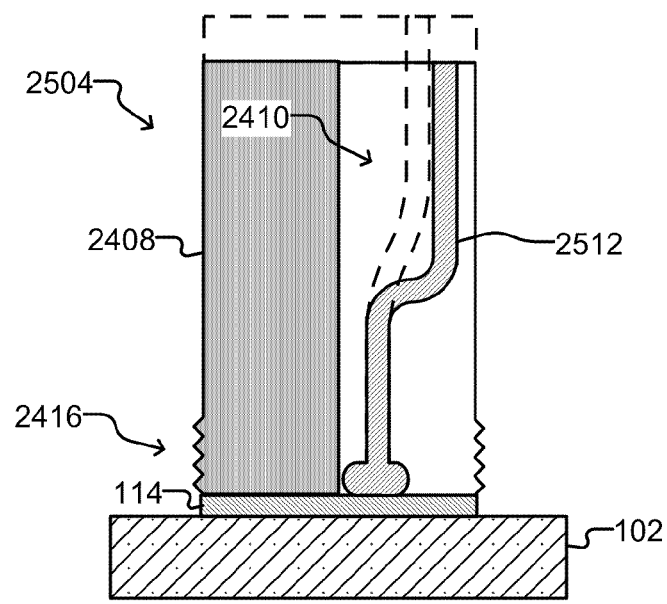
FIG. 25 illustrates another example of a spring contact structure comprising a carbon nanotube structure with an open portion and an electrical connection disposed in the open portion according to some embodiments of the invention.

FIG. 25 illustrates a cross section view of another non-limiting example of the spring contact structure 104 of FIG. 1 in the form of spring contact structure 2504 according to some embodiments of the invention. Spring contact structure 2504 is generally similar to spring contact structure 2404 of FIGS. 24A-24C, except that conductive structure 2512 is provided having a different shaped bend than conductive structure 2412. Accordingly, movement of conductive structure 2512 when compressed can be generally in a vertical direction, as compared to conductive structure 2412, which moves generally in a horizontal direction.

FIGS. 26A-26B illustrate in cross section view another non-limiting example of a process for making spring contact structures that are embodiments of the spring contact structure 104 in FIG. 1.

As shown in FIG. 26A, an electrically conductive structure 2612 (e.g. a wire) can be coupled to terminal 114 of substrate 102. For example, conductive structure 2612 can be attached to (e.g., bonded, soldered, welded, adhered with an electrically conductive adhesive, etc.) or formed on (e.g., deposited, plated, grown, etc.) terminal 114. Terminal 114 can comprise a growth material 2616 suitable for growing carbon nanotubes, for example as described above. Alternatively, terminal 114 can be coated with a growth material (e.g., using physical deposition). Conductive structure 2612 (or a portion of conductive structure 2612) can also be coated with a growth material 2616.

Carbon nanotubes 2618, 2620 can be grown from the growth material. For example, carbon nanotubes 2618 can be grown horizontally from conductive structure 2612 and carbon nanotubes 2620 can be grown vertically from terminal 114.

If desired, mold 2602 can be placed around terminals 114 and conductive structure 2612. Mold 2602 can guide the growing carbon nanotubes 2618, 2620 (and in particular, horizontally growing carbon nanotubes 2618) to form a column 2608 as shown in FIG. 26B. The mold 2602 can be removed after growing the carbon nanotubes, for example by physical removal, etching, etc. An electrically conductive cap 2614 can be attached the column 2608 if desired. Conductive cap 2614 can make electrical connection to conductive structure 2612, electrically connecting terminal 114 and cap 2614 together. Conductive cap 2614 can be like any of cap 214, 914, 1314 and variations thereof described above, and conductive structure 2612 can be like any of conductive structure 212 and 912 and variations thereof described above. Accordingly, conductive structure 2612 is a non-limiting example of electrical component 108 of FIG. 1, and column 2608 is a non-limiting example of the mechanical component 106 of FIG. 1.

Figure 27A:
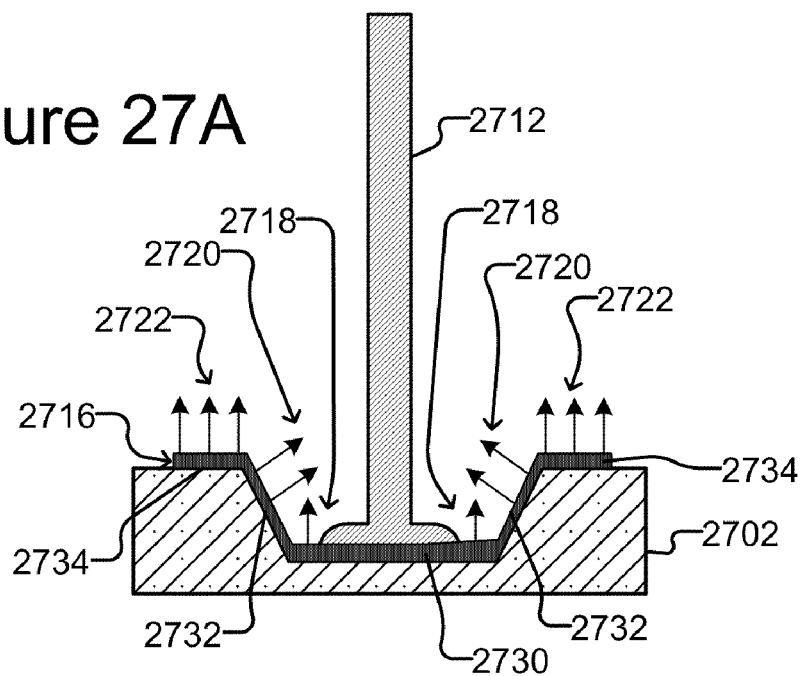
FIGS. 27A-27B illustrate another example of a process of making a spring contact structure according to some embodiments of the invention.
Figure 27B:
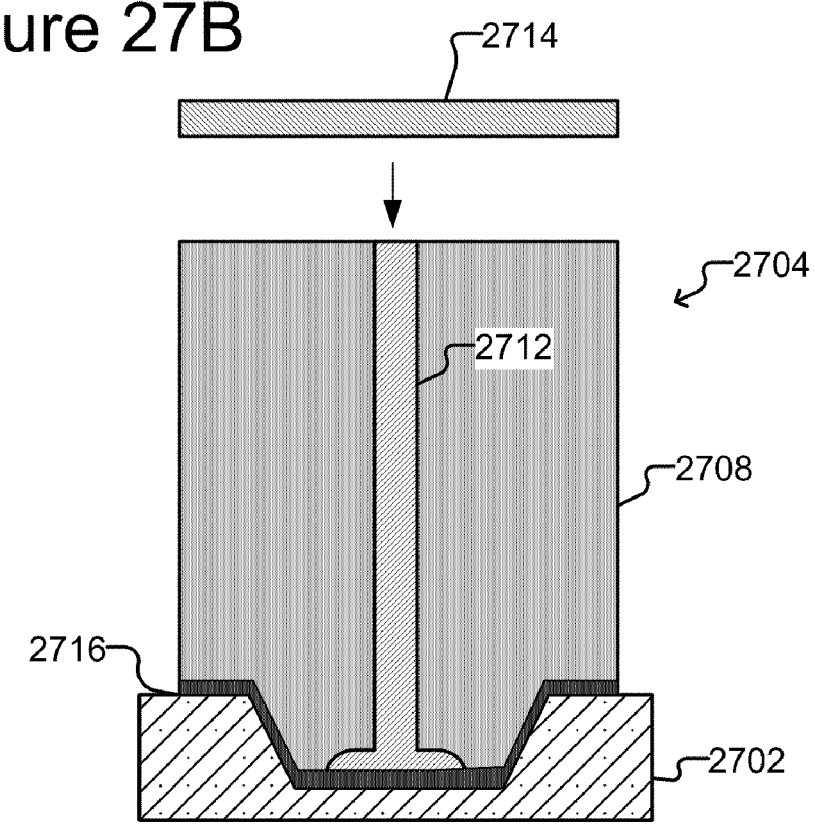

FIGS. 27A-27B illustrate in cross section view another non-limiting example of a process for making spring contact structures that are embodiments of the spring contact structure 104 in FIG. 1.

As shown in FIG. 27A an electrically conductive structure 2712 (e.g. a wire) can be coupled to first surface 2730 of growth material 2716. Conductive structure 2712 can be like conductive structure 2612 and can be attached or grown in a similar manner.

Growth material 2716 can be suitable for growing carbon nanotubes, for example as described above. Growth material 2716 can be disposed in a trench. For example, a trench can be formed by wet or dry etching and growth material can be deposited by physical deposition to form first surface 2730 and angled second surface 2732. For example, wet etching can be performed on silicon using KOH. Dry etching can be performed on silicon using reactive ion etching. Growth material can also be disposed on additional surfaces 2734 adjacent to the trench. Growth material can also be disposed (not shown) on the electrically conductive structure 2712, similar to as shown in FIGS. 26A-B.

Carbon nanotubes 2718, 2720, 2722 can be grown from the growth material. For example, vertically oriented carbon nanotubes 2718 can be grown from first surface 2730. Angled carbon nanotubes 2720 can be grown from angled surface 2732 toward conductive structure 2712. Additional carbon nanotubes 2722 can also be grown vertically from the additional surfaces 2734. Horizontally oriented carbon nanotubes can be grown from the electrically conductive structure 2712 if it is also coated with growth material. As shown in FIG. 27B, carbon nanotubes 2718, 2720, 2722 can form a column 2708 around the conductive structure 2712. If desired, a mold (not shown) like mold 2602 can be used to guide growth of carbon nanotubes 2718, 2720, 2722.

If desired, a conductive cap 2714 can be attached to column 2708. Cap 2714 can be in contact with conductive structure 2712, thus electrically connecting terminal 114 to cap 2714. Conductive cap 2714 can be like any of cap 214, 914, 1314 and variations thereof described above, and conductive structure 2712 can be like any of conductive structure 212 and 912 and variations thereof described above. Accordingly, contact structure 2704 is a non-limiting example of a spring contact structure 104, wherein conductive structure 2712 is a non-limiting example of electrical component 108 of FIG. 1, and column 2708 is a non-limiting example of the mechanical component 106 of FIG. 1.

FIGS. 28A-34B illustrate another non-limiting example of a process for making spring contact structures that are an embodiment of the spring contact structure 104 in FIG. 1.

Figure 28A:
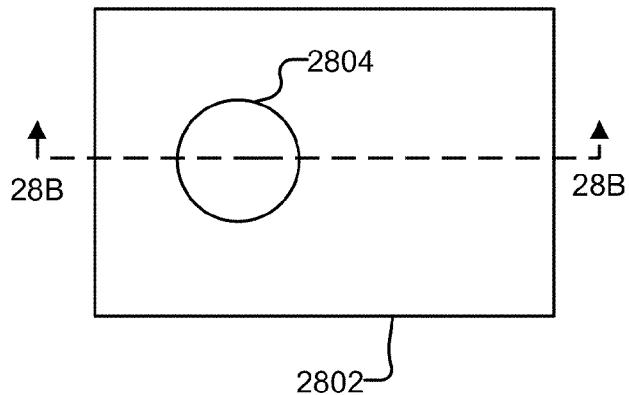
FIGS. 28A-34B illustrate another example of a process of making a spring contact structure according to some embodiments of the invention.
Figure 28B:
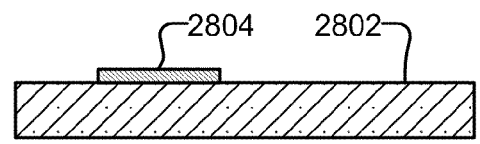
Figure 29A:
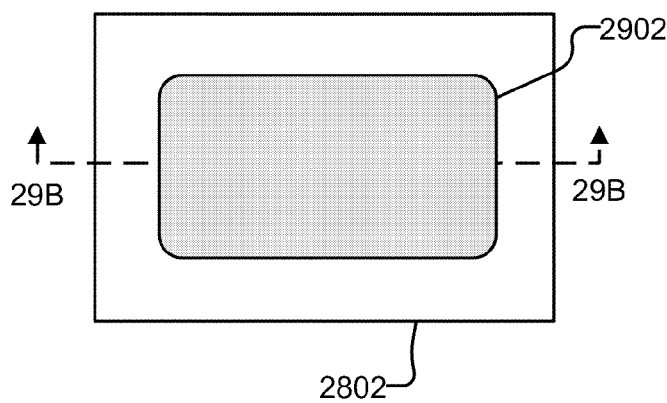
Figure 29B:
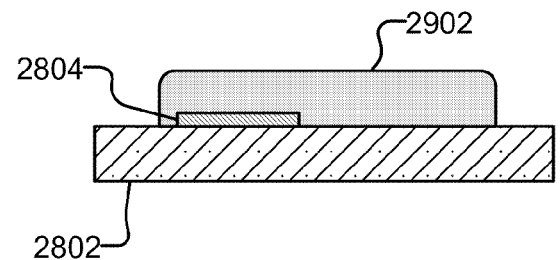
Figure 30A:
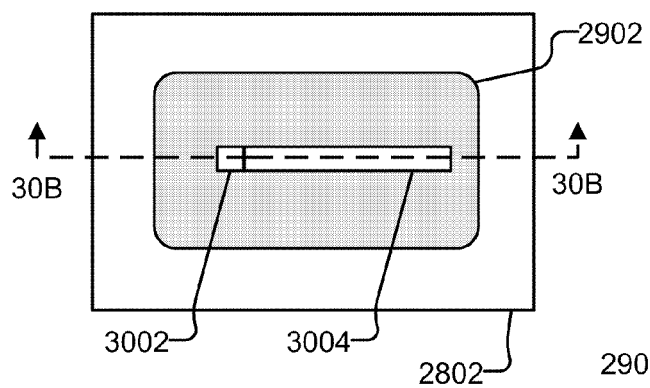
Figure 30B:
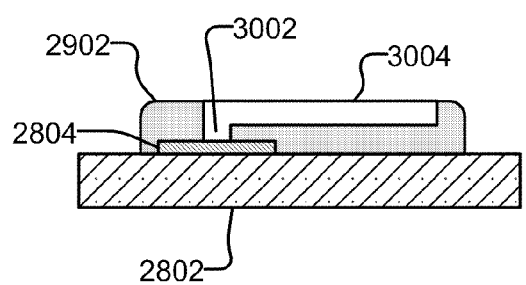

As shown in top view in FIG. 28A and in cross section view in FIG. 28B, a growth material 2804 can be disposed on a substrate 2802. Substrate 2802 can be like substrate 102. Growth material 2804 can be suitable for growing carbon nanotubes, for example as described above. As shown in top view in FIG. 29A and cross section view in FIG. 29B a masking material 2902 can be deposited onto growth material 2804 and substrate 2802. Masking material 2902 can be, for example, a photo resist. As shown in top view in FIG. 30A and cross section view in FIG. 30B, masking material 2902 can be patterned to provide a hole 3002 to expose growth material 2804 and to form a trench 3004. For example, one or more operations of depositing masking material, exposing masking material, and removing exposed (or unexposed) portions of masking material can be performed to create the hole 3002 and trench 3004 using a photolithographic process.

Figure 31A:
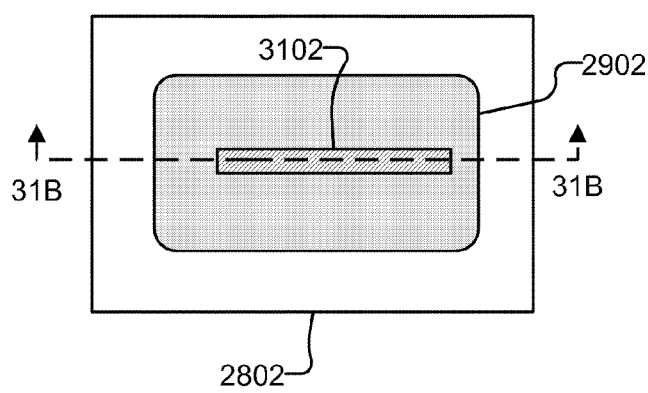
Figure 31B:
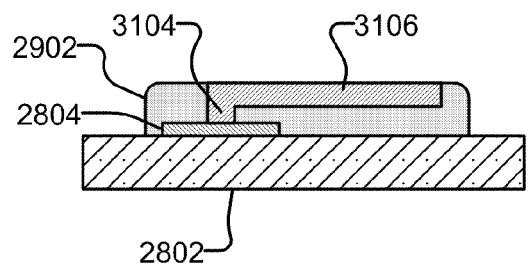
Figure 32A:
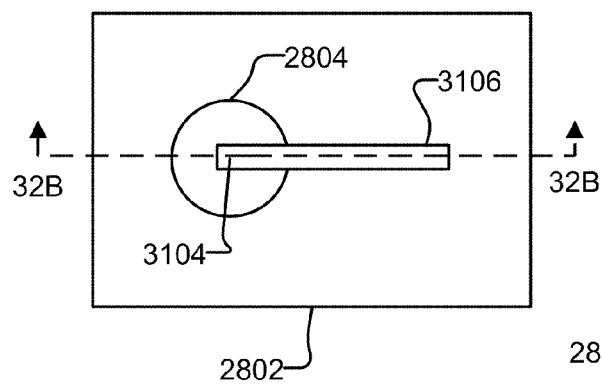
Figure 32B:
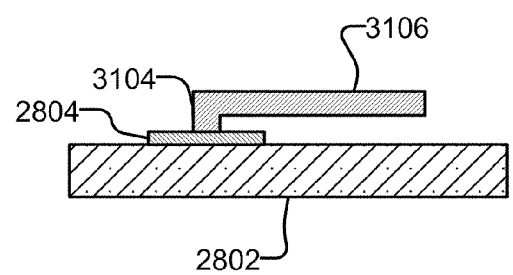

As shown in top view in FIG. 31A and in cross section view in FIG. 31B conductive material 3102 can be deposited into hole 3002 and trench 3004. For example, conductive material 3102 can be deposited by deposition, plating, or other suitable means. Conductive material 3102 can be a metal, such as copper, gold, aluminum, or other such material including alloys of the foregoing. As another non-limiting example, conductive material 3102 can comprise a bundle of conductive nanotubes. The conductive material can thus form a post 3104 (corresponding to hole 3002) extending vertically from growth material 2804 and beam 3106 (corresponding to trench 3004) extending horizontally from post 3104. As shown in top view in FIG. 32A and cross section view in FIG. 32B, the masking material 2902 can be removed after forming post 3104 and beam 3106, to leave the post and beam free standing. If desired, an adhesion material (not shown) can be deposited onto the growth material 3104 before the conductive material 3102 to enhance adhesion of the post 3104 to the growth material 2804.

Figure 33A:
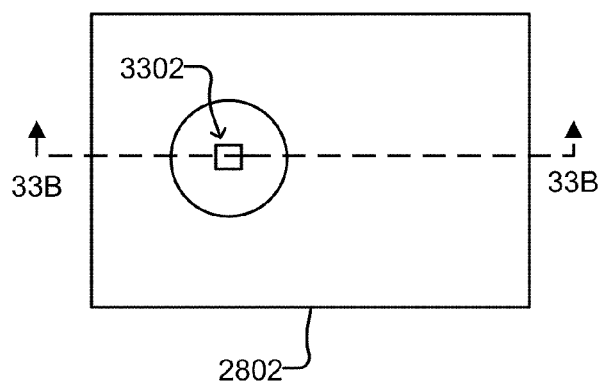
Figure 33B:
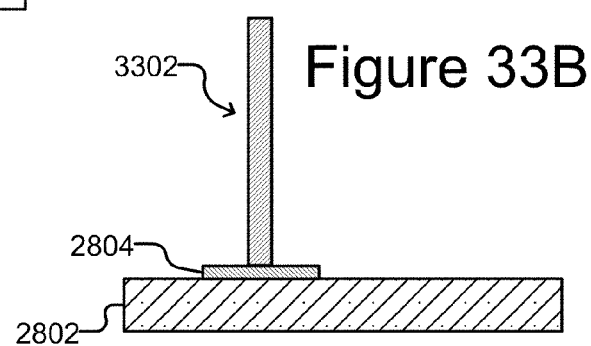

As shown in top view in FIG. 33A and cross section view in FIG. 33B, the beam 3106 can then be reformed to form an elongate conductive structure 3302. For example, the substrate 2802 can be spun (e.g., in a centrifuge) so that centrifugal forces cause the beam 3106 to stand up and reorient into a vertical position by permanent plastic deformation. Although conductive structure 3302 is shown as a perfectly straight column, it will be appreciated that, depending upon the particular conductive material 3102 and process conditions under which the substrate 2802 is spun, the resulting conductive structure 3302 may have a smaller or a larger kink (corresponding to the junction between the post 3104 and the beam 3106 of the deposited conductive material 3102). Any such kink is not illustrated in FIG. 33A for simplicity.

Alternatively, elongate conductive structure 3302 can be formed by attaching a wire or other conductive material to terminal 114, which is reoriented by being spun as described above.

Figure 34A:
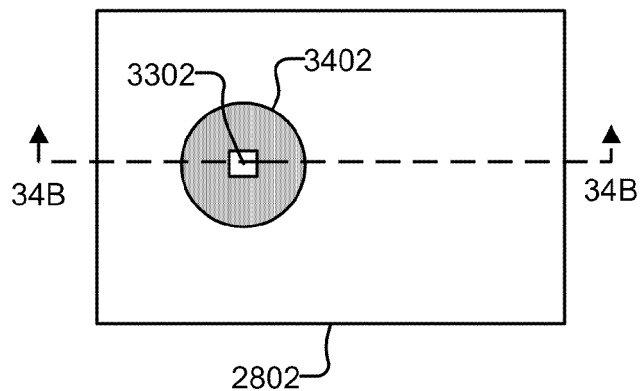
Figure 34B:
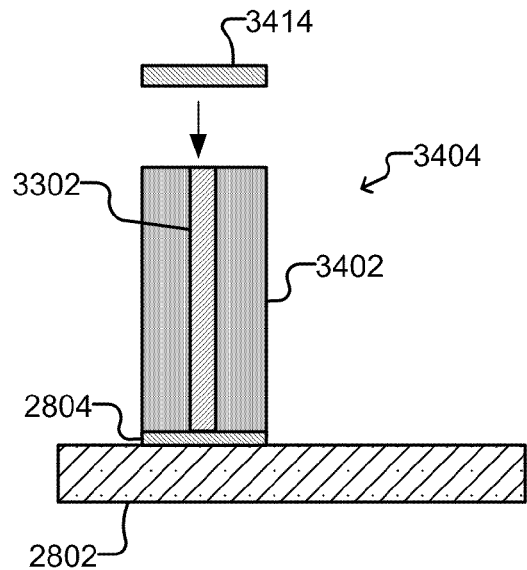

A carbon nanotube column 3402 can be formed using similar techniques as described above. For example, carbon nanotubes can be grown on growth material 2804 to form column 3402 around conductive structure 3302 as shown in top view in FIG. 34A and cross section view in FIG. 34B. If desired, an electrically conductive cap 3414 can be attached to the column 3402 as shown in FIG. 34B. Cap 3414 can be in contact with conductive structure 3302. Cap 3414 can be like any of cap 214, 914, 1314 and variations thereof described above. Accordingly, contact structure 3404 is a non-limiting example of a spring contact structure 104 of FIG. 1, wherein conductive structure 3302 (and cap 3414, if included) is a non-limiting example of electrical component 108 of FIG. 1, and column 3402 is a non-limiting example of the mechanical component 106 of FIG. 1.

FIGS. 35A-36B illustrate another non-limiting example of a process for making spring contact structures that are an embodiment of the spring contact structure 104 in FIG. 1.

Figure 35A:
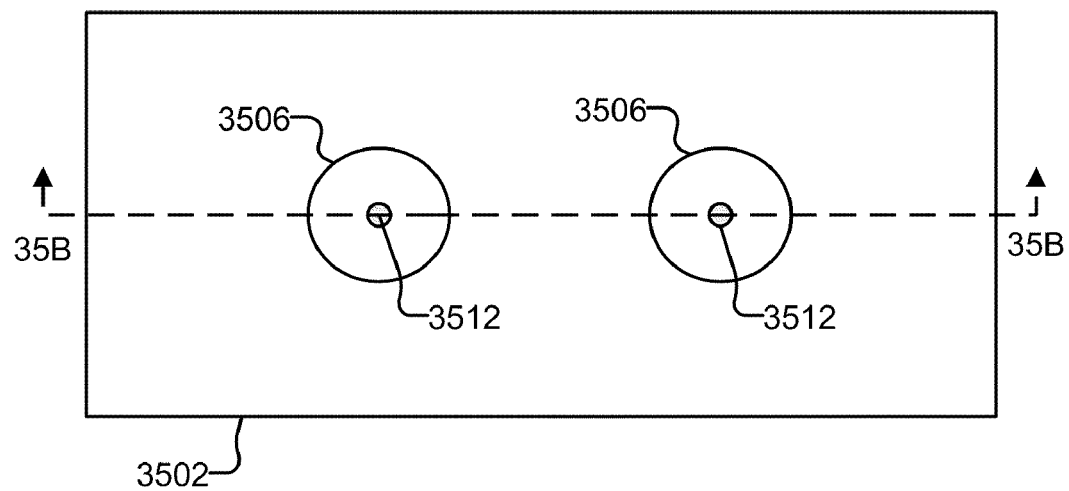
Figure 35B:
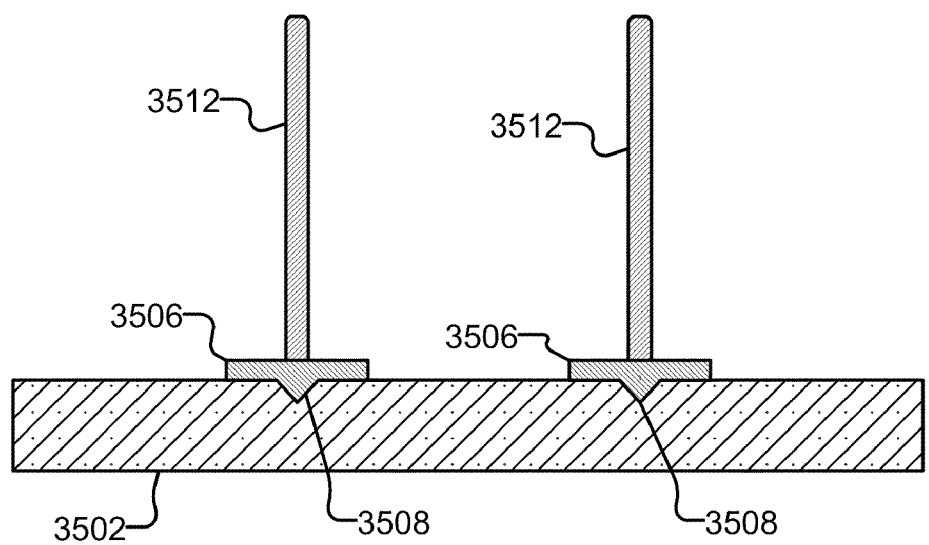

As shown in top view in FIG. 35A and cross section view in FIG. 35B, contact structures can be formed on a substrate 3502. Substrate 3502 can be like substrate 102. The contact structures can have a base 3506 and a tip 3508. The bases 3506 and/or tips 3508 can be formed in various ways. For example, pits can be etched into the substrate 3502 in the reverse shape desired for the tips 3508. A masking material can be deposited and patterned to leave an opening over the pit and having a reverse shape of the bases 3506. The bases 3506 and tips 3508 can then be formed by depositing conductive material into the pits and the openings, after which the masking material can be removed. A conductive structure 3512 can be coupled to the bases 3506. For example, conductive structure 3512 can be like any of wire 212 and 912 and variations thereof, and made in a similar manner. As another non-limiting example, conductive structure can be like any of conductive structures 2412, 2212, 2312, 2412, 2512, 3302 and variations thereof and made in a similar manner.

Figure 36A:
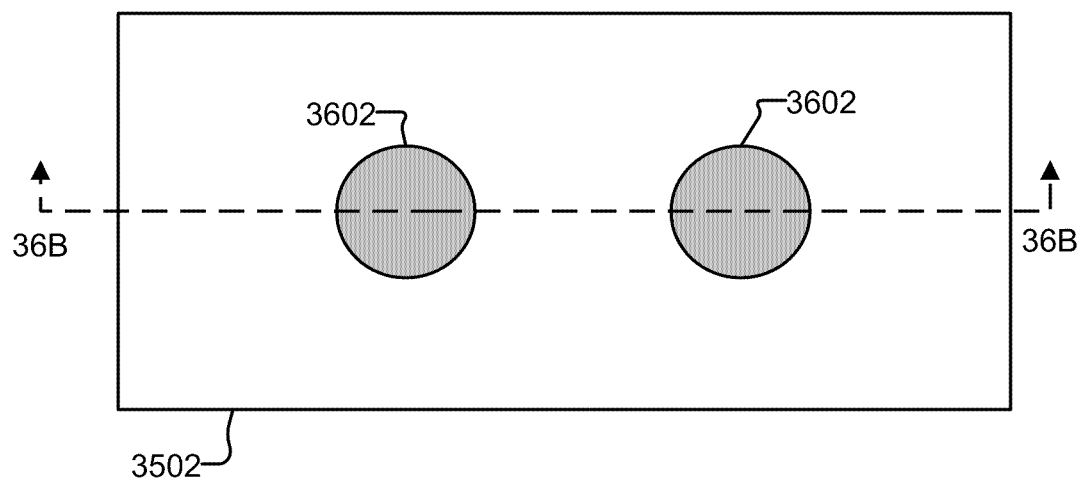
Figure 36B:
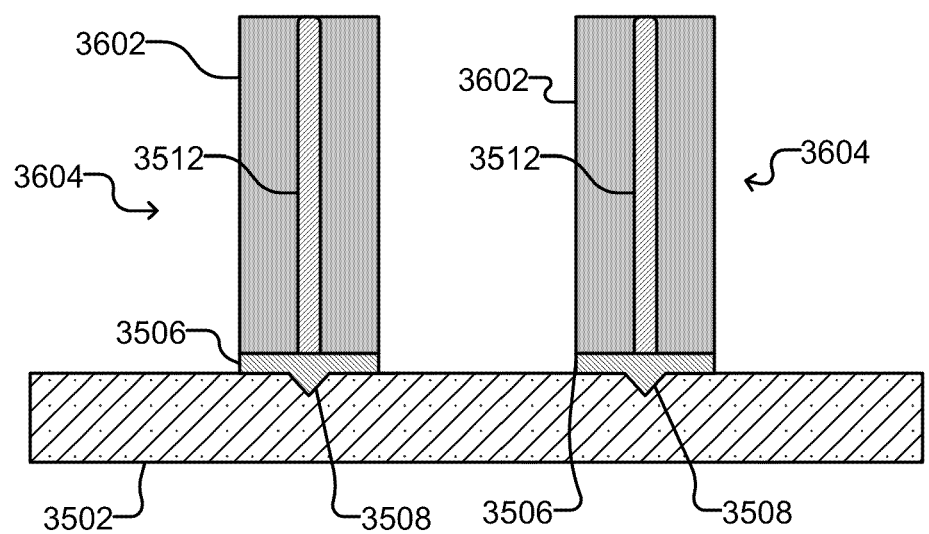

As shown in top view in FIG. 36A and cross section view in FIG. 36B, carbon nanotubes can be grown on the bases 3506, to form contact structure 3604. Carbon nanotubes can be grown using similar techniques as discussed above. For example, the bases 3506 can include a growth material or be coated with a growth material suitable for growing carbon nanotubes. The grown carbon nanotubes can form columns 3602. If desired, a mold (not shown), like mold 2602 can be used to guide the growth of the carbon nanotubes.

Accordingly, contact structure 3604 is a non-limiting example of a spring contact structure 104 of FIG. 1, wherein conductive structure 3512 is a non-limiting example of electrical component 108 of FIG. 1, and column 3602 is a non-limiting example of the mechanical component 106 of FIG. 1. Contact structure 3604 can be assembled on the tip 3508, transferred to another substrate, and the tip 3508 released from substrate 3502, for example as described further below. Similarly, additional embodiments of processes for making contact structures can include forming contact structures like 204, 904, 1804, 2104, 2204, 2304, 2404, 2504, 2604, 2704, 3404 on a tip.

If desired, additional operations on spring contact structures can be performed. For example, spring contact structures can be integrated into an electrical device, such as a probe card assembly. FIGS. 37-39B illustrate additional operations in a process for making spring contact structures that can be applied to contact structures 3604 of FIG. 36. Although the additional operations are illustrated using the contact structures 3604, the additional operations that can be applied to any of the contact structures and variations thereof disclosed herein (e.g., contact structures 204, 904, 1804, 2104, 2204, 2304, 2404, 2504, 2604, 2704, 3404).

Figure 37A:
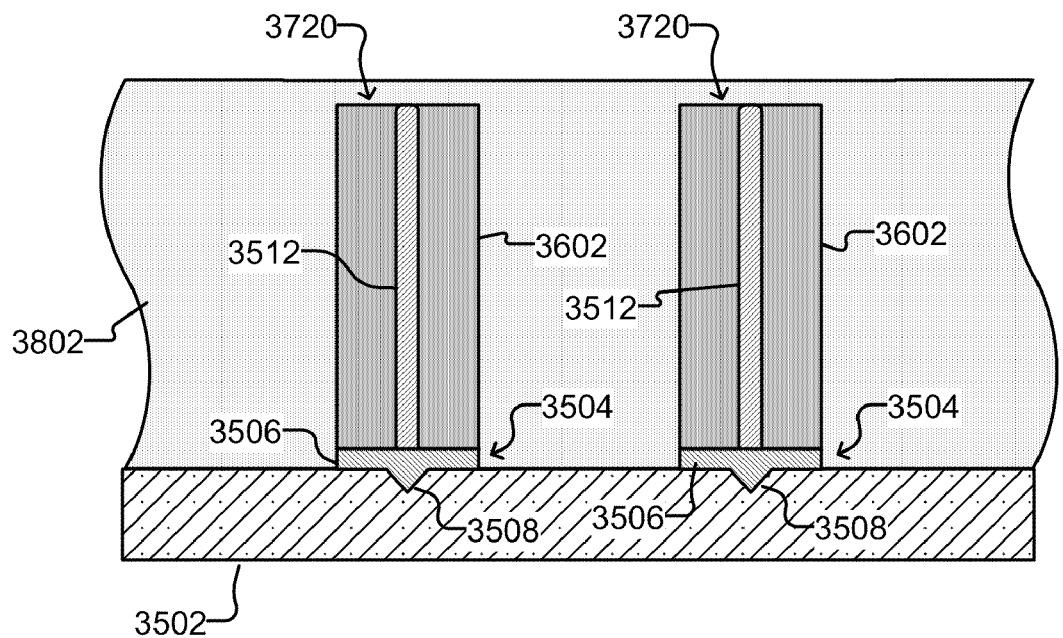
FIGS. 37A-39B illustrate additional operations that can be included in a process of making a spring contact structure according to some embodiments of the invention.
Figure 37B:
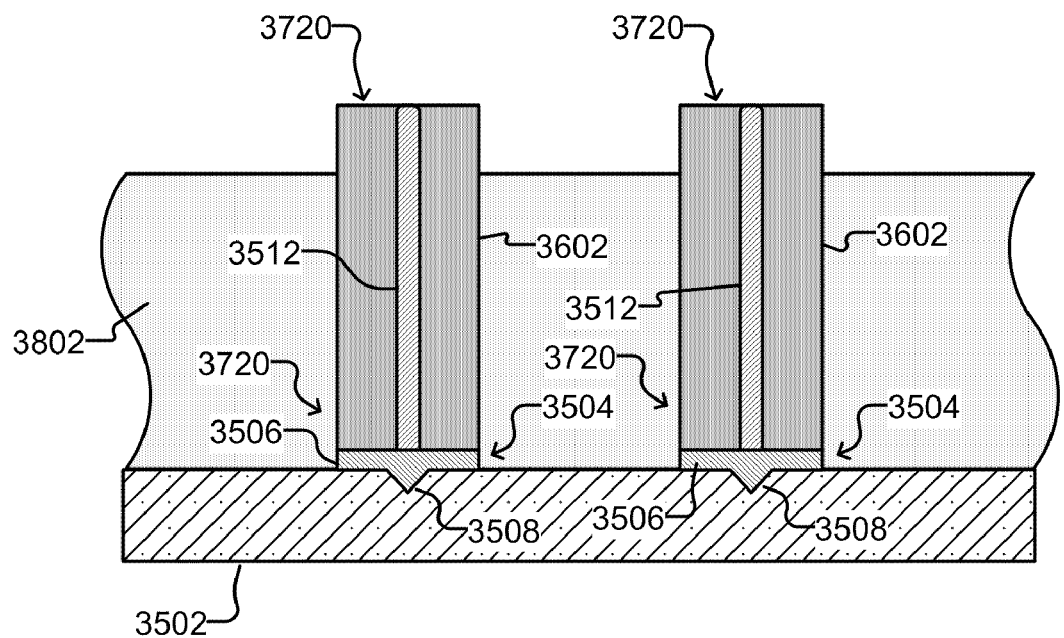

As shown in side view in FIG. 37A, a filler material 3802 can be disposed onto the substrate 3502 and around and between the columns 3602. The filler material 3802 can be, for example, acrylic polymer, polydimethylsiloxane (PDMS), or other low modulus materials like polyurethane. The filler material 3802 can help to hold the columns 3602 in place and strengthen the columns 3602 so that additional operations can be performed to the ends 3720 of the columns. For example, portions of the filler material 3802 and portions of the ends 3720 can be removed by grinding, lapping, and similar processes. This can expose the conductive structures 3512 at ends 3720 of the columns 3602. For example, exposing the conductive structures 3512 can make it easier to form an electrical connection (e.g., to a tip). The removal of ends 3720 can also help to planarize the ends 3720 of the columns. In other words, by planarizing, the resulting columns can have a substantially uniform length (height above the substrate 3802). Following lapping (or similar processes), portions of the filler material can be removed (e.g., by etching) to leave the ends 3702 of the columns exposed, as shown in side view in FIG. 37B. Base portions 3722 of the columns can remain anchored in the filler material 3802.

Figure 38A:
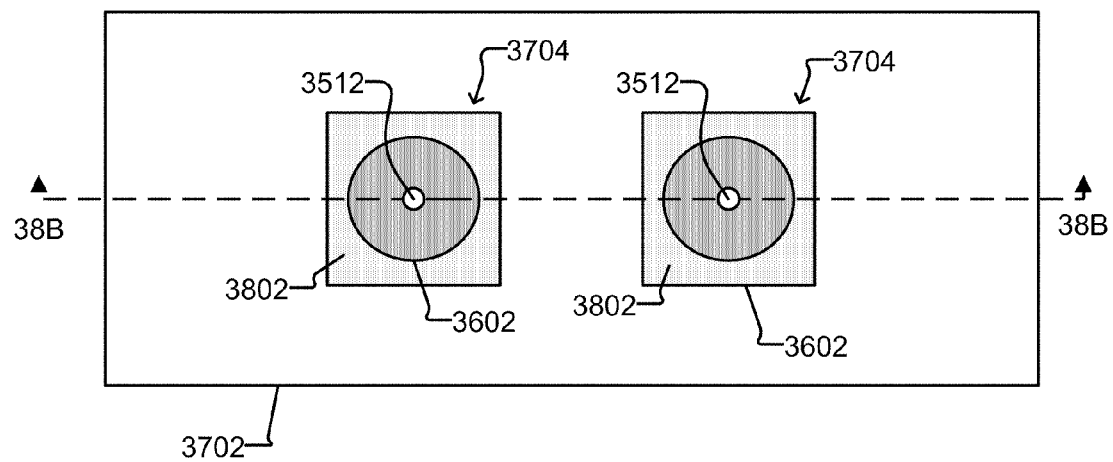
Figure 38B:
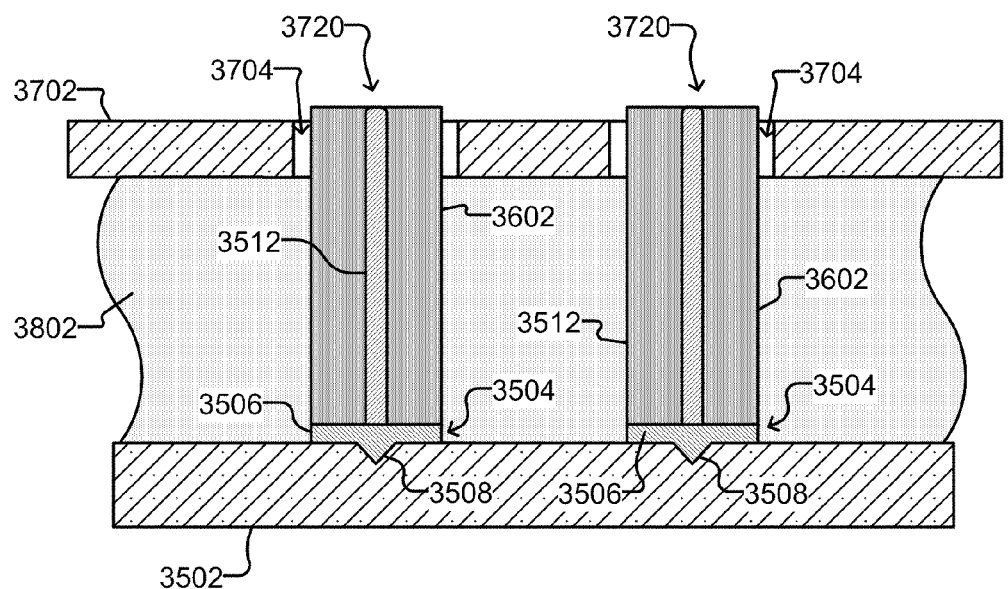

As shown in top view in FIG. 38A and side view in FIG. 38B, the ends 3720 of the columns 3602 can be inserted into openings 3704 in another substrate 3702. Substrate 3702 can be like substrate 102.

Figure 39A:
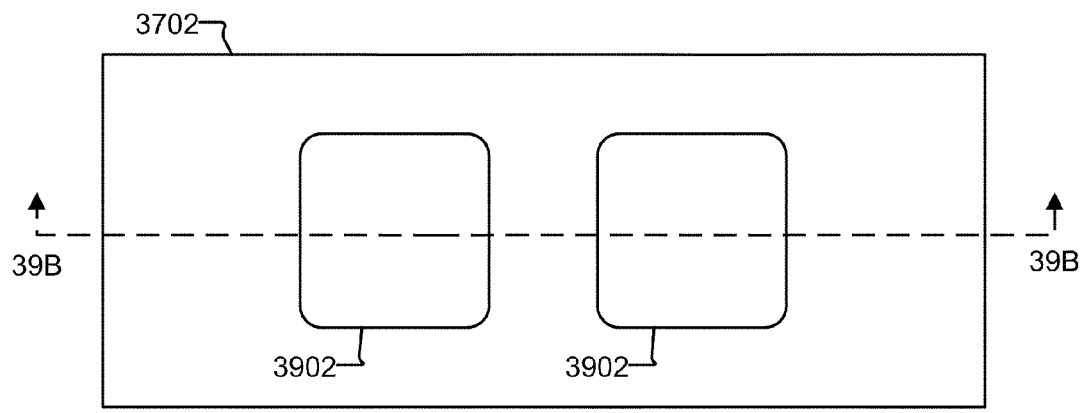
Figure 39B:
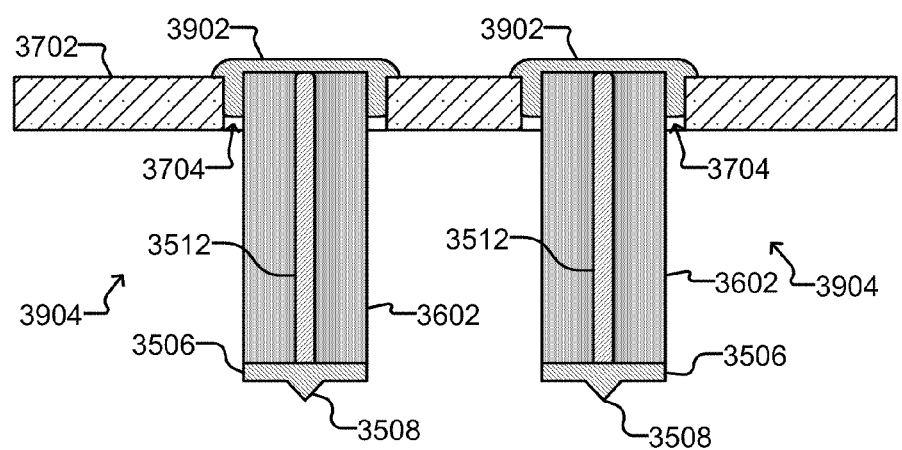

As shown in top view in FIG. 39A and cross section view in FIG. 39B, the columns 3602 can be attached to substrate 3702. For example, a joining material 3902 (e.g., solder, plating material, conductive epoxy, etc.) can join ends 3720 of columns 3602 to substrate 3702. The joining material 3902 can be electrically conductive and can contact the conductive structure 3512, thus electrically connecting the contact structure 3506 to the joining material 3902, and electrical conductors (not shown) on substrate 3702. The joining material 3902 can also provide mechanical anchoring of the columns 3602 to substrate 3702. The contact structures 3604 can be released from substrate 3502 after being joined to substrate 3702, leaving tip 3508 and base 3506 free and exposed. All or some of filler material 3802 can also be removed.

Accordingly, columns 3602 and conductive structure 3512 embedded in the column can be a spring contact structure 3904 that is an embodiment of the spring contact structure 104 of FIG. 1. The base 3504, tip 3508, and conductive structure 3512 are an example of the electrical component 108 of FIG. 1, and the column 3602 is an example of the mechanical component 106 of FIG. 1.

Returning to FIG. 19, any of the contact structures shown in FIGS. 21-39B (e.g., spring contact structures 2104, 2204, 2304, 2404, 2504, 2604, 2704, 3402, 3604, 3904) and variations thereof can be used in a probe card. For example, any of the contact structures can be used as spring contact structures 1906 and/or 1910. Alternatively or in addition, any of the contact structures and variations thereof can be used as probes 1914. Accordingly substrate 102, 2802, 3502, 3702 can be a probe head, part of a probe head, interposer, test board, wiring substrate, or the like Returning to FIG. 20, any of the contact structures shown in FIGS. 21-34B (e.g., spring contact structures 2104, 2204, 2304, 2404, 2504, 2604, 2704, 3402, 3604, 3904) and variations thereof can be used as spring contacts 2014 in the test socket 200.

Although the discussion above has generally shown one or two spring contact structures, it is to be understood that many spring contact structures can be made and used in the manners described above. Accordingly, a device using spring contact structures can include hundreds, thousands, tens of thousands, or more spring contact structures.

Although specific embodiments and applications of the invention have been described in this specification, these embodiments and applications are exemplary only, and many variations are possible. Accordingly, there is no intention that the invention be limited these exemplary embodiments and applications or to the manner in which the exemplary embodiments and applications operate or are described herein. For example, features shown in one embodiment can be combined with features shown in another embodiment. Spring contacts illustrated herein can be made using processes different from those described, and the processes described herein can be used to make different types of spring contacts than those illustrated. Accordingly, it is not intended that the invention be limited except as by the claims set forth below.

We claim:

1. A composite spring contact structure for making a pressure based electrical connection with an electrical device, the composite spring contact structure comprising:
    a structural component comprising a group of carbon nanotubes, the structural component being a resilient spring structure and having first mechanical characteristics and first electrical characteristics; and
    a conduction component having second electrical characteristics that are different than the first electrical characteristics of the structural component, the conduction component further having second mechanical characteristics that are different than the first mechanical characteristics of the structural component,
    wherein:
        the structural component and the conduction component are distinct structures,
        the structural component provides a dominant mechanical characteristic of the composite spring contact structure, and
        the conduction component provides a dominant electrical characteristic from one end of the composite spring contact structure to an opposite end of the composite spring contact structure.

2. The composite spring contact structure of claim 1, wherein the structural component is elastically deformable in a particular elastic range.

3. The composite spring contact structure of claim 2, wherein:
    the structural component is plastically deformable but not elastically deformable outside of the particular elastic range; and
    an electrical resistance of the conduction component is less than an electrical resistance of the structural component.

4. The composite spring contact structure of claim 1, wherein:
    the structural component comprises a column comprising a first end coupled to a terminal of a substrate, and the column comprises a hollow interior portion extending from the first end to a second end opposite the first end, and
    the conduction component comprises an electrically conductive material disposed within the hollow interior portion and connecting the terminal to an electrically conductive cap at the second end of the column.

5. The composite spring contact structure of claim 4, wherein the electrically conductive material comprises a wire.

6. The composite spring contact structure of claim 5, wherein the wire has a serpentine shape.

7. The composite spring contact structure of claim 5, wherein the wire has a spiral shape.

8. The composite spring contact structure of claim 1, wherein:
    the structural component comprises a column comprising a first end coupled to a terminal of a substrate; and
    the conduction component comprises an electrically conductive structure embedded within the column and extending a length of the column from the terminal to an electrically conductive cap disposed at a second end of the column.

9. The composite spring contact structure of claim 1, wherein the conduction component is a wire.

10. The composite spring contact structure of claim 9, wherein the column comprises:
    first carbon nanotubes oriented generally parallel to a length of the wire; and
    second carbon nanotubes oriented generally perpendicular to the length of the wire.

11. The composite spring contact structure of claim 9 further comprising a gap between a length of the wire and an interior portion of the column, the gap defined by a ball at the end of the wire that is coupled to the terminal.

12. The composite spring contact structure of claim 1, wherein:
    the structural component comprises a column coupled at a first end to a terminal on a substrate, and
    the conduction component comprises:
        an electrically conductive cap disposed at a second end of the column, and
        a plurality of electrically conductive structures coupled at first ends to the terminal and at second ends to the cap, the conductive structures disposed within the column.

13. The composite spring contact structure of claim 12, wherein the electrically conductive structures are wires.

14. The composite spring contact structure of claim 1, wherein:
    the structural component comprises a column coupled at a first end to a surface of a substrate, and
    the conduction component comprises:
        an electrically conductive cap disposed at a second end of the column, and
        an electrical connection from the cap to a terminal disposed adjacent the column on the surface of the substrate.

15. The composite spring contact structure of claim 14, wherein the electrical connection comprises:
    an electrically conductive post coupled to the terminal, and
    a wire between the cap and the post.

16. The composite spring contact structure of claim 1, wherein:
    the structural component comprises a column coupled at a first end to a substrate, the column comprising an opening into the column along a length of the column from the first end to a second end, and the conduction component comprises a wire disposed within the opening and coupled at a first end to the substrate, a second end of the wire being disposed adjacent the second end of the column.

17. The composite spring contact structure of claim 16, wherein while the column is in an uncompressed state, the wire is pre-bent such that the wire moves in a predetermined direction away from the column as the column is compressed.

18. The composite spring contact structure of claim 16, wherein the wire has a length longer than the length of the column.

19. The composite spring contact structure of claim 1, wherein each of the first mechanical characteristics and the second mechanical characteristics comprise spring constant, and the spring constant of the structural component is substantially greater than the spring contact of the conduction component.

20. The composite spring contact structure of claim 1, wherein each of the first electrical characteristics and the second electrical characteristics comprise conductivity, and the conductivity of the conduction component is substantially greater than the conductivity of the structural component.

21. The composite spring contact structure of claim 1, wherein the conduction component extends from the one end of the spring contact structure to the opposite end of the spring contact structure, the conduction component thereby providing a continuous electrical path from the one end to the opposite end.

22. The composite spring contact structure of claim 21, wherein:

the one end of the composite spring contact structure is configured to be attached to a substrate that is distinct from the electrical device, and the opposite end of the composite spring contact structure is configured to contact the electrical device and thereby make the pressure based electrical connection with the electrical device.

23. The composite spring contact structure of claim 22, wherein the one end of the composite spring contact structure is configured to be attached to an electrical terminal of the substrate.

24. The composite spring contact structure of claim 21, wherein the electrical conductivity of the spring contact structure from the one end to the opposite end is substantially the same as the electrical conductivity of the conduction component.

25. The composite spring contact structure of claim 24, wherein a mechanical characteristic of the spring contact structure from the one end to the opposite end is substantially the same as the mechanical characteristic of the structural component.

26. The composite spring contact structure of claim 25, wherein the mechanical characteristic is at least one of spring constant and elastic range.

27. The probe card assembly of claim 24, wherein a mechanical characteristic of the spring contact structure from the one end to the opposite end is substantially the same as the mechanical characteristic of the structural component.

28. The probe card assembly of claim 27, wherein the mechanical characteristic is at least one of spring constant and elastic range.

29. The composite spring contact structure of claim 1, wherein:

the structural component deforms elastically in response to a particular force on the opposite end of the spring contact structure, and the conduction component deforms plastically in response to the particular force.

30. A probe card assembly comprising:

an electrical interface to a tester;

a plurality of probes disposed to contact electronic devices to be tested; and electrical connections between the interface and the probes, wherein each of the probes comprises a spring contact structure comprising:

a structural component comprising a group of carbon nanotubes, the structural component being a resilient spring structure and having first mechanical characteristics and first electrical characteristics; and a conduction component having second electrical characteristics that are different than the first electrical characteristics of the structural component, the conduction component further having second mechanical characteristics that are different than the first mechanical characteristics of the structural component, wherein:

the structural component and the conduction component are distinct structures, the structural component provides a dominant mechanical characteristic of the composite spring contact structure, and the conduction component provides a dominant electrical characteristic from one end of the composite spring contact structure to an opposite end of the composite spring contact structure.

31. The probe card assembly of claim 30 further comprising:

a wiring substrate, wherein the electrical interface is disposed on the wiring substrate; and a probe substrate coupled to the wiring substrate, wherein the probes extend from the probe substrate.

32. The probe card assembly of claim 30 further comprising a plurality of the probe substrates coupled to the wiring substrate, wherein the probes extend from the plurality of the probe substrates.

33. The probe card assembly of claim 30, wherein the conduction component comprises a wire.

34. The probe card assembly of claim 30, wherein each of the first mechanical characteristics and the second mechanical characteristics comprise spring constant, and the spring constant of the structural component is substantially greater than the spring contact of the conduction component.

35. The probe card assembly of claim 30, wherein each of the first electrical characteristics and the second electrical characteristics comprise conductivity, and the conductivity of the conduction component is substantially greater than the conductivity of the structural component.

36. The probe card assembly of claim 30, wherein the conduction component extends from the one end of the spring contact structure to the opposite end of the spring contact structure, the conduction component thereby providing a continuous electrical path from the one end to the opposite end.

37. The probe card assembly of claim 36 further comprising a probe substrate from which the probes extend, wherein:

the one end of the composite spring contact structure is attached to the probe substrate, and the opposite end of the composite spring contact structure is configured to contact the electrical devices to be tested.

38. The probe card assembly of claim 37, wherein the one end of the composite spring contact structure is attached to an electrical terminal of the probe substrate.

39. The probe card assembly of claim 36, wherein the electrical conductivity of the spring contact structure from the one end to the opposite end is substantially the same as the electrical conductivity of the conduction component.

40. The probe card assembly of claim 30, wherein:

the structural component deforms elastically in response to a particular force on the opposite end of the spring contact structure, and the conduction component deforms plastically in response to the particular force.

* * * * *